United States Patent
Takahashi et al.

[11] Patent Number: 6,133,069
[45] Date of Patent: Oct. 17, 2000

[54] METHOD OF MANUFACTURING THE ELECTRONIC USING THE ANODE JUNCTION METHOD

[75] Inventors: Yoshiharu Takahashi; Toshiaki Shinohara, both of Kikuchi-gun, Japan

[73] Assignee: Mitsubishi Denki Kabushiki Kaisha, Tokyo, Japan

[21] Appl. No.: 09/249,090

[22] Filed: Feb. 12, 1999

Related U.S. Application Data

[62] Division of application No. 08/499,906, Jul. 11, 1995, Pat. No. 5,900,671.

[30] Foreign Application Priority Data

Jul. 12, 1994 [JP] Japan .................................... 6-160350

[51] Int. Cl.⁷ .................................................. H01L 21/48
[52] U.S. Cl. ....................... 438/119; 438/118; 438/123; 438/124; 438/127
[58] Field of Search ...................... 438/118, 119, 438/123, 124, 127, 106, 121; 257/642, 666, 668, 676, 692, 735, 787; 29/827, 829; 228/118, 119; 156/60

[56] References Cited

U.S. PATENT DOCUMENTS

| | | | |
|---|---|---|---|
| 3,397,278 | 8/1968 | Pomerantz | 174/52 |
| 4,010,488 | 3/1977 | Gruszka et al. | 257/786 |
| 4,291,293 | 9/1981 | Yamada et al. | 338/4 |
| 4,322,980 | 4/1982 | Suzuki et al. | 73/727 |
| 4,495,820 | 1/1985 | Shimada et al. | 73/724 |
| 4,607,276 | 8/1986 | Butt | 257/674 |
| 4,712,082 | 12/1987 | Ito et al. | 338/4 |
| 4,773,972 | 9/1988 | Mikkor | 204/16 |
| 4,874,499 | 10/1989 | Smith et al. | 204/403 |
| 4,949,158 | 8/1990 | Ueda | 257/774 |
| 5,041,900 | 8/1991 | Chen et al. | 257/698 |
| 5,065,223 | 11/1991 | Matsuki et al. | 257/678 |
| 5,153,710 | 10/1992 | McCain | 257/724 |
| 5,343,064 | 8/1994 | Spangler et al. | 257/350 |
| 5,371,386 | 12/1994 | Tokunoh et al. | 257/181 |
| 5,431,806 | 7/1995 | Suzuki et al. | 204/415 |
| 5,436,503 | 7/1995 | Kunitomo et al. | 257/737 |

(List continued on next page.)

FOREIGN PATENT DOCUMENTS

| | | |
|---|---|---|
| 1665042 | 10/1970 | Germany . |
| 4010644 | 8/1981 | Germany . |
| 4231325 | 9/1992 | Germany . |
| 4230039 | 4/1993 | Germany . |
| 4311762 | 10/1994 | Germany . |
| 53-28747 | 3/1978 | Japan . |
| 63-117233 | 5/1988 | Japan . |
| 2106954 | 4/1990 | Japan . |
| 2141442 | 5/1990 | Japan . |
| 2180036 | 7/1990 | Japan . |
| 350141 | 3/1991 | Japan . |
| 2209831 | 9/1991 | Japan . |
| 4117809 | 4/1992 | Japan . |
| 4164841 | 6/1992 | Japan . |
| 4299541 | 10/1992 | Japan . |
| 5335474 | 12/1993 | Japan . |
| WO9424701 | 10/1994 | WIPO . |

OTHER PUBLICATIONS

Hatada et al., "LED Array Modules By New Technology Microbump Bonding Method", IEEE Transactions on Components, Hybrids, and Manufacturing Technology, vol. 13, No. 3, Sep. 1990, pp. 521–527.

*Primary Examiner*—John Guay
*Assistant Examiner*—Alonzo Chambliss
*Attorney, Agent, or Firm*—Leydig, Voit & Mayer, Ltd.

[57] ABSTRACT

An electronic component includes an inner lead having a tip with a projection; an insulating coating that is electrically conductive when heated disposed around the projection; and a metallic coating disposed around an electrode on a semiconductor chip, with a crater reaching the electrode, the projection engaging the crater to make a contact between the inner lead and the electrode, the insulating coating and the metallic coating being anodically bonded to each other.

1 Claim, 32 Drawing Sheets

U.S. PATENT DOCUMENTS

| | | | |
|---|---|---|---|
| 5,442,231 | 8/1995 | Miyamoto et al. | 257/668 |
| 5,453,628 | 9/1995 | Hartsell et al. | 257/76 |
| 5,463,255 | 10/1995 | Isono | 257/773 |
| 5,478,973 | 12/1995 | Yoon et al. | 174/260 |
| 5,528,078 | 6/1996 | Shin | 257/676 |
| 5,530,282 | 6/1996 | Tsuji | 257/666 |
| 5,556,810 | 9/1996 | Fujitsu | 438/118 |
| 5,614,742 | 3/1997 | Gessner et al. | 257/254 |
| 5,619,065 | 4/1997 | Kim | 257/673 |
| 5,710,077 | 1/1998 | Brehm et al. | 438/472 |
| 5,760,467 | 6/1998 | Itihashi | 257/676 |
| 5,820,648 | 10/1998 | Akaike et al. | 65/36 |
| 5,900,671 | 5/1999 | Takahashi et al. | 257/735 |

METHOD OF MANUFACTURING THE ELECTRONIC USING THE ANODE JUNCTION METHOD

This disclosure is a division of patent application Ser. No. 08/499,906, filed on Jul. 11, 1995 now U.S. Pat. No. 5,900,671.

BACKGROUND OF THE INVENTION

1. Field of the Invention

The present invention relates to an electronic component manufactured using an anodic junction and a method of manufacturing the electronic component and, more particularly, to an electrical contact between a wire and an electrode with an insulating layer surrounding each electrode on a semiconductor chip surface, an electrically conductive surface of each wire being anodically bonded when the wire is simultaneously pressure-joined and connected to an electrode on the semiconductor chip surface.

2. Description of the Related Art

FIG. 39 is a perspective view showing electrodes 2 attached to a surface of a semiconductor chip 1, according to a conventional ultrasonic thermocompression wire bonding method, connected through gold wires 5 to inner leads 4 extending from lead frames, not shown. FIG. 40 is a diagrammatic illustration of one end of the gold wire connected to the electrode 2 on the semiconductor chip 1 by ultrasonic thermocompression bonding.

In FIG. 40, the semiconductor chip 1 is fixedly secured through a die bonding material 6 to a die pad 41. The die bonding material 6 and the die pad 41 can withstand the pressure from a capillary 7 when a ball 51 at the tip of the gold wire 5 is connected to the electrode 2 by ultrasonic thermocompression bonding and, further, to support the semiconductor chip 1. In the ultrasonic thermocompression wire bonding method, the tip of the gold wire 5 passing through the capillary 7 is turned into the ball 51 by means of a high-voltage discharge. Subsequently, the ball 51 is pressed against the electrode 2 on the semiconductor chip 1 and subjected to ultrasonic vibration and heat, whereby it is ultrasonically thermocompression-bonded to the electrode 2, as indicated at 52 in the same illustration. Further, the capillary 7 is moved to the position of the tip of the inner lead 4 before being lowered to couple the tip of the inner lead 4 to the gold wire 5.

FIGS. 41A, 41B, and 42 are illustrations of a structure of a lead frame with the electrodes 2 coupled through the gold wires 5 to the tips of the inner leads 4 in accordance with a conventional ultrasonic thermocompression wire bonding method. In FIG. 41A, a frame 3 is integral with eight die pads 41, not shown, and thirty-six inner leads 4, not shown. FIG. 41B is an enlarged view showing a portion indicated by X in FIG. 41A. In FIG. 41B, the frame 3 has thirty-six inner leads 4 at its inside portion, a die pad 41 supported by suspending leads 42 at the central portion of the frame, and external leads 44 at its circumferential portion. FIG. 42 is an illustration of the detailed structure of the thirty-six inner leads 4, die pad 41, and suspending leads 42. In the same illustration, a rectangle indicated by a broken line is representative of a position that is encapsulated with a molding resin. FIG. 43 is a cross-sectional view showing a semiconductor device completed such that the electrode 2 is connected through the gold wire 5 to the inner lead 4 by ultrasonic thermocompression wire bonding before the frame 3 is encapsulated with a molding resin 8. In the same illustration, reference numeral 53 designates a contact portion between the inner lead 4 and the gold wire 5 due to the ultrasonic thermocompression bonding. FIG. 44 is an enlarged view showing a pressure-bonded portion between an electrode, not shown, and the inner lead 4 on the chip 1, and FIG. 45 is an illustration of the deformation of the ball 51 when the ball 51 is ultrasonically thermocompression-bonded onto the electrode 2 on a surface of the semiconductor chip 1. When the electrode 2 is an aluminum electrode, the gold wire 5 and the deformed ball portion 52 both consist of the same gold wire material at the time of completion of the ultrasonic thermocompression bonding, while an alloy of gold and aluminum is formed as a pressure-bonded layer 54 with the aluminum electrode. Reference numeral 2i depicts an electrically insulating passivation film (which will be referred to hereinafter as an electrically insulating film) attached to the semiconductor chip 1 at a position other than the electrode 2.

FIG. 46 illustrates a deformed ball portion 52 of the gold wire 5 pressed against the electrode 2 by means of the capillary 7 in the completed connection. FIG. 47 shows the other end of the gold wire 5 stitch-bonded to the inner lead 4 by the capillary 7 and its deformed portion 53 pressed against the tip of the inner lead 4. In FIG. 47, although the material of the deformed portion 53 stitch-bonded to the inner lead 4 depends upon the lead frame material, when an iron frame is used, it is silver plated, and hence an alloy layer made of gold and silver is produced on the stitch side. For this reason, the alloy layer 54 of gold is present, as shown in FIG. 45, but has been omitted in FIG. 47.

FIGS. 48A to 48E are illustrations for describing processes taken when the inner lead 4 is connected through the gold wire 5 to an electrode on the semiconductor chip 1 according to the conventional ultrasonic thermocompression wire bonding technique. In FIG. 48A, heat is transferred from a heating block 9 through the die pad 41 to the chip 1 by heat conduction. The tip of the gold wire 5 leading from the tip of the capillary 7 is formed into a ball by a high voltage power supply torch 10. FIG. 48B shows the capillary 7 lowered toward the electrode 2 (omitted from the illustration) so that the formed ball 51 is pressure-bonded to the electrode under ultrasonic vibration and pressure. FIG. 48C illustrates the capillary 7 through which the gold wire 5 passes moved toward the inner lead 4 in order for the other end of the gold wire 5 to be connected to the inner lead 4 after ultrasonic thermocompression bonding of the ball 51 is completed, as shown in FIG. 45. FIG. 48D is illustrative of the other end of the gold wire 5 stitch-bonded to the inner lead 4, and FIG. 48E is illustrative of the other end of the gold wire 5 pressure-attached to the inner lead 4 by the stitch bonding in the state as shown in FIG. 47, before the gold wire 5 is held and lifted by a clamp 11 of the capillary 7, to be cut off at the stitch bonded portion.

FIG. 49 is a plan view of a semiconductor chip 1 produced such that the electrode 2 and the inner lead 4 are coupled through the gold wire 5 to each other by means of ultrasonic thermocompression bonding. FIG. 50 illustrates nineteen electrodes 2 on the semiconductor chip 1 wherein reference numeral 2i designates an electrically insulating film attached to a portion other than the electrodes 2 on the semiconductor chip 1. The electrode 2 has dimensions C×E and the electrically insulating film 2i has dimensions B×D, larger than the dimensions of the electrode 2, and hence the boundary between the electrode 2 and the electrically insulating film 2i appears so that the electrode 2 is exposed as shown in FIG. 51. The cross-sectional structure of the semiconductor chip 1 is such that the electrically insulating film 2i overlaps the circumferential portion of the electrode 2, as shown in FIG. 45. As illustrated in FIG. 51, in order to increase the electrical and mechanical degree of coupling of the gold wire 5, the area of the electrode 2 should be larger than the circumferential area of the deformed ball 52 when the ball 51 is ultrasonically thermocompression-bonded.

Depending upon the accuracy of the wire bonding apparatus, the dimension A between the electrodes 2 as shown in FIG. 51 is determined taking the circumferential dimension of the deformed ball 52 and other factors into consideration. In general, as long as the ultrasonic thermocompression bonding is made, the width of the electrode 2 to be wire-bonded should be larger than the width of the circuit wiring 21 in FIG. 51. Further, in the case of the conventional wire bonding method, the semiconductor device should be designed on the basis of dimensions I, J, K, and L as shown in FIG. 52 while taking into account the accuracy and performance of the wire bonding.

FIG. 53 is a cross-sectional view taken along the axis where the gold wire 5 shown in the plan view of FIG. 52 extends between the electrode 2 and the inner lead 4. Whether the dimension of the gold wire 5 relative to the corner portion of the semiconductor chip 1 is satisfactory can be known by checking the dimension I. The space between the corner of the die pad 41 and the gold wire 5 can be confirmed on the basis of the dimension J and the relationship between the die pad 41 and the inner lead 4. In addition, dimension K must be confirmed to know whether there is sufficient dimension to the stitch bonding 53.

FIG. 54A is a perspective view showing the inner structure of a completed semiconductor device (integrated circuit) in which the inner lead 4 is connected through the gold wire 5 to the electrode 2 located at the central portion of the chip 1 according to the ultrasonic thermocompression wire bonding method. FIG. 54B is a cross-sectional view taken along line 54B—54B in FIG. 54A. FIG. 55A is a cross-sectional view of a conventional TAB package. In the same illustration, numeral 21 represents an electrode bump formed on a tape carrier electrode lead (which will be referred hereinafter to as an electrode lead) 4b through thermocompression bonding. FIG. 55B is an enlarged view showing the contact portion of the electrode with the electrode bump 21. In the TAB system, the connection between the electrode of the semiconductor chip 1 and the electrode lead 4a is made through the electrode bump 21, thus accomplishing electrical coupling between the electrode and the electrode lead 4a.

FIG. 56 is an illustration for describing one example of a method of anodically bonding a silicon semiconductor body (member) with an electrically insulating material (member), as disclosed in Japanese Patent Publication No. 53-28747. In FIG. 56, a semiconductor material 1a is placed on a resistance heating strip 67 that is energized by a power supply A. Onto a surface of the semiconductor material 1a there is attached a glass film 1b, an insulating coating (for example, boro-silicate glass made of boric acid and silicic acid) which shows a slight electrical conductivity when heated. Further, numeral 68 designates an electrically insulating material which is layered on and with the semiconductor material 1a with the insulating film 1b interposed therebetween, and numeral 65 denotes a pressure connecting piece for lightly pressing the electrically insulating material 68 against the semiconductor material 1a. Further, a positive electrode terminal 63 of a direct-current power supply 60 is connected to the resistance heating strip 67 for causing a positive current to flow from the semiconductor material 1a to the electrically insulating material 68, while the negative electrode terminal is connected with the pressure connecting piece 65.

Next, a description is given of the anodic bonding method. The semiconductor material 1a is heated through the resistance heating strip 67 to the extent that the insulating coating 1b is slightly electrically conductive (to approximately 400 to 700 degrees, depending upon the insulating material). As a result, a small positive current (for example, several $\mu A/mm^2$) flows for about one minute from the semiconductor material 1a to the electrically insulating material 68, whereby an anodically grown oxide junction is formed at the boundary between the semiconductor material 1a and the electrically insulating material 68, thus completing the anodic bonding between the semiconductor material 1a and the electrically insulating material 68.

At this time, the electrically insulating material 68 is not melted by the heating temperature or the applied current. The heating is only for giving an electrically conductive property to the insulating coating 1b. The junction between the semiconductor material 1a and the electrically insulating material 68 can be achieved only with the positive current flowing from the semiconductor material 1a to the electrically insulating material 68.

FIG. 57 is an illustration for describing one example of a method of anodically bonding two semiconductor materials 1c and 1d made of silicon with an electrically insulating material 68, as disclosed again in Japanese Patent Publication No. 53-28747. In this method, the two semiconductor materials 1c and 1d whose surfaces are attached to the insulating coating 1b are placed on the electrically insulating material 68 which, in turn, is mounted on the resistance heating strip 67. The semiconductor materials 1c and 1d are respectively equipped with direct-current power supplies 61 and 62 for causing positive currents to flow, and the positive electrode terminals of the direct-current power supplies 61 and 62 are connected to the corresponding semiconductor materials 1c and 1d, respectively, while the negative electrode terminals are connected in common to the resistance heating strip 67.

Furthermore, in the anodic bonding method, the resistance heating strip 67 heats the semiconductor materials 1c and 1d through the electrically insulating material 68 so that the insulating coating 1b has a slight electrical conductivity. As a result, a small positive current (for example, several $\mu A/mm^2$) flows for about one minute from the semiconductor materials 1c and 1d to the electrically insulating material 68, whereby an anodically grown oxide junction is formed at the boundary between the semiconductor materials 1c and 1d and the electrically insulating material 68, thus completing the junction between the semiconductor materials 1c and 1d and the electrically insulating material 68.

As examples of general applications of the anodic bonding method disclosed in other publications, Japanese Patent Application No. 1-185242 and Publication No. 4-164841 disclose a method wherein the rear surface of a silicon wafer is used as an electrically conductive surface which, in turn, is bonded to a glass wafer. Japanese Patent Publication No. 53-28747 exemplifies, as a semiconductor, a junction between silicon and quartz, a junction between silicon and boro-silicate glass made of boric acid and silicic acid, a heat resistant glass having a low expansion coefficient, a junction between germanium and a boro-silicate glass, and a junction between silicon and sapphire.

Moreover, as an example of special applications, Japanese Patent Publication No. 63-117233 discloses a method of anodically bonding a silicon wafer with a silicon supporting wafer in a capacitance-type pressure sensor. A detailed description of the principle of the anodic bonding method will be omitted here as it is given in the Japanese Patent Publication No. 53-28747 and others.

FIG. 58 is a plan view showing a conventional laminated multi-layer insulating substrate, and FIG. 59 is a cross-sectional perspective view showing the longitudinal structure of FIG. 58. In FIG. 58, numeral 70 designates a laminated multi-layer insulating substrate, numeral 71 depicts an insulating plate, and 76 stands for a wiring pattern on the insulating plate 71. Further, in FIG. 59, numerals 71 to 75 indicate five stacked insulating plates, and numerals 76 to 81 and the black-colored portions represent wiring patterns on the insulating plates 71 to 75, respectively. For formation of the laminated multi-layer insulating substrate 70 by stacking the insulating plates 71 to 75 on top of each other, lead wires are inserted into through-holes in the insulating plates 71 to 75 and electrically coupled to the wiring of the insulating plates 71 to 74 stacked on each other.

The joining methods of the conventional technology were described above in the following order: the wire bonding method, the bump junction method using TAB, and the anodic bonding method. The anodic bonding method has been known as a means of coating a chip surface with an insulating film as well as bonding a silicon strain gauge with a base used for stress relaxation in a pressure sensor.

In conventional anodic bonding, the silicon to be bonded to a glass insulating plate has some degree of rigidity and, for the junction, a glass insulating plate, which also has the same degree of rigidity as the silicon, is used.

In the foregoing description, the wire bonding method must include 1) formation of the ball, 2) heating, application of pressure, and supply of ultrasonic vibration in the ultrasonic thermocompression bonding, 3) movement of the capillary, 4) ultrasonic thermocompression bonding of the stitch portion, and 5) practicing the five processes for cutting the gold wire for each inner lead. In the bump junction by TAB, 1) heating and compression bonding, and 2) the moving process are repeated for each of the electrode junctions. Collective bonding is still not put into practice. In these bonding methods, the electrode and the electrode to be electrically connected to each other, i.e., a metallic conductor and a metallic conductor, are made to be joined with each other by ultrasonic thermocompression bonding or thermocompression bonding. For this reason, the mechanical strength of the portions to be electrically connected to each other, for example, the shear strength, depends upon the state of the bonded portions.

In addition, the portions that are ultrasonically thermocompression-bonded or thermocompression-bonded due to metal contact and frictional heating and the applied load produce an alloy layer. Accordingly, a safe strength cannot be ensured except where the area of the junction is large. For instance, when the diameter of the gold wire is $\phi=25$ $\mu$m, the diameter $\phi$ of the contact surface of the junctioned portion is set to $\phi=100$ $\mu$m; that is, the diameter is four times and the area is sixteen times that of the gold wire.

The following problems arise with the conventional contact methods for the electrode and the inner lead.

a) In the conventional method in which the connection between the electrode and the inner lead is made through a gold wire having an extremely low rigidity, it is necessary to provide mechanical strength to both end portions of the gold wire to be electrically connected, so that the dimension of the connected portion needs to exceed the value necessary for the electrical connection. As a result, the dimensions of the electrodes on the chip must be large, which goes against the object of increasing the density of integrated circuits (IC). This is an obstacle to miniaturizing IC chips.

b) In the prior method wherein the junction between the inner lead and the electrode is made through a member such as the gold wire having an extremely low rigidity, it is necessary that the semiconductor chip and the inner lead be encapsulated in order to protect both end portions of the gold wire and the gold wire itself against external loads or to protect the semiconductor chip against the external environment. Accordingly, increasing the outer dimensions of the semiconductor device to a given value is unavoidable.

c) Because of the recent higher integration of ICs, the number of electrodes is increasing. However, in the conventional wire bonding method or bump junction method by TAB, in order to ensure mechanical strength, the dimension of the electrode needs to be increased, with the result that the dimension of the entire chip depends upon the number of electrodes, thus presenting a barrier to miniaturizing IC chips.

d) In cases where the number of connection pins exceeds one hundred, even if the connection accuracy varies because the joining work is carried out for each of the electrodes, difficulty is experienced in checking whether the contacts with the electrodes are normal.

e) Since it is difficult to know an accurate value of the mechanical strength of the alloy layer made at the junction by ultrasonic thermocompression bonding or thermocompression bonding, it is necessary to design the bonded portion with a high safety factor. For this reason, a sufficient over-design is required, taking into account vibration during the assembly process, empty weight, and other external forces, and hence a limitation on designing occurs.

f) In a conventional electrode connecting method, the connecting work needs to be repeatedly done the same number of times as the number of electrodes or twice the number of electrodes. For this reason, as the number of the pins in the semiconductor device increases, the time required for making the connections increases.

SUMMARY OF THE INVENTION

It is, therefore, an object of this invention to provide an electronic component and method of manufacturing the electronic component making an electrical connection between an inner lead and an electrode, providing a strong mechanical junction between the inner lead and an insulating film around the electrode, and collectively bonding inner leads to each of a plurality of electrodes according to the anodic bonding method.

It is another object of the present invention to provide an electronic component in which inner leads or electrodes are directly connected with outer leads.

According to a first aspect of the invention, an electronic component comprises an electrical conductor for inputting and outputting a current, a circuit element having electrodes to be electrically connected, an insulating coating which is electrically conductive when heated and adhered to an area around the electrodes, the electrodes being anodically bonded so that the electrical conductor and the electrodes are electrically connected to each other. This allows the electrical conductor to be connected to the circuit element with a mechanical firmness without being melted and improves the degree of electrical coupling of the electrical conductor with the electrodes.

According to a second aspect of the invention, an electronic component comprises an insulating coating which is electrically conductive when heated and adhered onto a portion of a surface of a semiconductor chip other than electrodes formed on the semiconductor chip, a tip of an inner lead extending from a lead frame being anodically bonded to the insulating coating so that the inner lead is electrically coupled to the electrode. This allows the inner lead to be joined to the semiconductor chip with a mechanical firmness as well as improves the degree of electrical coupling of the inner lead with the electrode.

According to a third aspect of the invention, in an electronic component, a metallic coating is attached to an insulating passivation film on a surface of a semiconductor chip. The semiconductor chip is used as an anode for anodically bonding to a wiring substrate and further avoids any influence from electromagnetic waves or the like because the uppermost surface of the semiconductor chip is covered by the metallic coating.

According to a fourth aspect of the invention, in an electronic component, the surface of an electrode on a semiconductor chip is higher than the uppermost surface of an insulating coating on the semiconductor chip surface and that is electrically conductive when heated, with the result that the degree of electrical coupling between the anodically bonded insulating coating and the inner lead is improved.

According to a fifth aspect of the invention, in an electronic component, a tip of an electrode has a convex configuration. With this structure, when the inner lead and the insulating coating are anodically bonded to each other, the top of the electrode easily breaks along the inner lead, thus improving the degree of electrical coupling and making it easy to adjust the position of the tip.

According to a sixth aspect of the invention, in an electronic component, the surface of an electrode on a semiconductor chip is lower than the uppermost surface of an insulating coating that is electrically conductive when heated and that is attached to the semiconductor chip surface. With this structure, it is possible to place a conductive material in the low portion to ensure connection between the inner lead and the electrode.

According to a seventh aspect of the invention, in an electronic component, a conductive material with a low elastic modulus is placed on an electrode on a surface lower than a surface of an insulating coating that is electrically conductive when heated, with a portion of the conductive material protruding from the surface of the insulating coating. With this structure, the conductivity between the electrodes and the inner lead is improved due to the conductive material.

According to an eighth aspect of the invention, in an electronic component, the conductive material with a low elastic modulus is mercury. When the mercury ball is compressed, the contact areas between the mercury, the inner lead, and the electrode become larger, thereby improving the conductivity between the electrodes and the inner lead.

According to a ninth aspect of the invention, in an electronic component, an insulating coating which is electrically conductive when heated is adhered to a portion of a surface of an inner lead anodically bonded to a semiconductor chip and is placed on a wiring conductor of a circuit substrate so that the insulating coating and the wiring conductor are anodically bonded to each other. With this structure, it is possible to mount the semiconductor chip on the circuit substrate without an external connection lead extending from the semiconductor chip.

According to a tenth aspect of the invention, in an electronic component, an end of an inner lead anodically bonded to a semiconductor chip is bent along an edge of the semiconductor chip to make an outer lead. This structure produces a smaller-sized semiconductor device.

According to an eleventh aspect of the invention, there is provided an electronic component manufactured according to this invention wherein an insulating coating which is electrically conductive when heated is adhered to a surface of a semiconductor chip to avoid electrodes on the semiconductor chip, and the semiconductor chip is mounted on a circuit substrate on which, in addition to a wiring conductor electrically joined with the electrodes, a conductive element is patterned and contacts the insulating coating. The insulating coating and the conductive element are anodically bonded to each other to make an electrical contact between the electrodes and the wiring conductor. With this structure, the mechanical contact of the semiconductor chip and the circuit substrate is strong, while the electrical connection between the electrodes and the wiring conductor is firm.

According to a twelfth aspect of the invention, there is provided an electronic component manufactured according to this invention wherein an insulating coating which is electrically conductive when heated is adhered to a patterned conductive element insulated from a patterned wiring conductor on a first circuit substrate, and a wiring conductor electrically coupled to the first-mentioned wiring conductor and a conductive element insulated from the second-mentioned wiring conductor are patterned on a second circuit substrate. The second circuit substrate is placed on the first circuit substrate, before the insulating coating and the conductive piece are anodically bonded to each other, thus creating a laminated circuit substrate. This structure has a laminated wiring substrate with a high dimensional accuracy in thickness.

According to a thirteenth aspect of the invention, an electronic component manufactured according to this invention includes an insulating coating which is electrically conductive when heated, adhered to a portion of a wiring conductor contacting portion of an outer lead of a semiconductor device, and disposed on a wiring conductor of a circuit substrate so that the insulating coating and the wiring conductor are anodically bonded to each other to mount the semiconductor device on the circuit substrate. This structure allows a plurality of semiconductor devices to be simultaneously mounted on the wiring substrate.

According to a fourteenth aspect of the invention, an electronic component manufactured according to this invention includes a projection on a tip of an inner lead and an insulating coating which is electrically conductive when heated attached to a region around the projection, and a metallic coating is adhered to a region around an electrode on a semiconductor chip with a predetermined thickness to form a crater reaching the electrode, the projection being engaged with the crater to make contact between the inner lead and the electrode so that the insulating coating and the metallic coating are anodically bonded to each other. This structure makes the contact between the inner lead and the electrodes strong.

According to a fifteenth aspect of the invention, an electronic component manufactured according to this invention includes an opening extending to an inner lead in an insulating coating attached to a tip of the inner lead and that is electrically conductive when heated to create a crater engaged with a convex electrode protruding from a metallic coating on a surface of a semiconductor chip. The inner lead and the electrodes come into contact with each other so that the insulating coating and the metallic coating are anodically bonded to each other. This structure makes the contact between the inner lead and the electrodes strong.

According to a sixteenth aspect of the invention, an electronic component manufactured according to this invention includes an insulating coating which is electrically conductive when heated adhered to a rear surface of a semiconductor chip and the semiconductor chip is placed on a die pad of a lead frame before the insulating coating and the die pad are anodically bonded to each other to fix the lead frame pad to the semiconductor chip. This structure makes the die bonding material unnecessary, thereby making it possible to manufacture a semiconductor device at low cost.

According to a seventeenth aspect of the invention, in a method of manufacturing an electronic component, an insulating coating which is electrically conductive when heated is adhered to the entire surface of a semiconductor chip, other than the electrodes, before a tip of each of the inner leads is positioned or aligned with a top surface of a corresponding electrode. The electrodes and the inner leads are simultaneously electrically connected to each other when the inner leads and the insulating coating are joined with each other by anodic bonding. Thus, each inner lead can be mechanically and firmly joined with the semiconductor chip over a wide area, and the inner leads and the electrodes can be electrically coupled with each other.

According to an eighteenth aspect of the invention, in a method of manufacturing an electronic component, an insulating coating which is electrically conductive when heated is built up on a surface of a semiconductor chip formed by division of a semiconductor wafer into a plurality of sections, except on electrodes, to form craters around the electrodes, and a conductive material with a low elastic modulus is fitted into the craters so that a portion is exposed, and a tip of an inner lead of a lead frame is positioned on a top surface of each electrode so that the inner lead and the insulating coating are joined with each other by anodic bonding. The inner leads and the electrodes are electrically coupled to each other while the conductive material is brought into contact with the electrodes under pressure when the insulating coating is bonded to the inner lead. With this structure, the conductive material can enlarge the contact area between the inner leads and the electrodes as well as improve the degree of coupling therebetween.

According to a nineteenth aspect of the invention, in a method of manufacturing an electronic component, an insulating coating which is electrically conductive when heated is adhered to a portion around a bump on an electrode section of a semiconductor chip, and the bump at the electrode section is placed on an inner lead formed by etching a TAB tape before the insulating coating and the inner lead are anodically bonded to each other to electrically couple the electrode through the bump to the inner lead. This arrangement connects the semiconductor chip to the inner leads with fewer processes than the conventional TAB mounting method.

According to a twentieth aspect of the invention, in a method of manufacturing an electronic component, an insulating coating which is electrically conductive when heated is adhered to a bottom surface of a semiconductor device with an external wiring ball grid array so that a top portion of the ball grid array is exposed before the ball grid array is located on a circuit substrate for anodic bonding of the insulating coating and the wiring conductors so that the ball grid array and the wiring conductors are electrically connected to each other. Since the ball grid array and the wiring conductors are electrically connected with each other in the anodic bonding process, even if the semiconductor device has a multi-pin structure, it is possible to mount the semiconductor device on the wiring substrate in a short time with fewer processes.

According to a twenty-first aspect of the invention, there is provided an electronic component comprising an electrical conductor for inputting and outputting a current, a circuit element having an electrode, an insulating coating which is electrically conductive when heated adhered to a portion of the circuit element around the electrode, and a section anodically bonding the conductor to the insulating coating to cover the electrode. With this structure, it is possible to achieve a mechanically firm junction between the conductor and the circuit element without needing to melt the conductor, as well as to increase the degree of electrical coupling of the conductors to the electrodes.

According to a twenty-second aspect of the invention, there is provided an electronic component comprising a semiconductor chip having electrodes thereon, an insulating coating which is electrically conductive when heated adhered to a portion of the circuit element other than the electrodes, a lead frame having inner leads electrically connected to the electrodes, and an anodic bonding section bonding the inner leads with a surface of the semiconductor chip to cover the electrodes. With this structure, it is possible to produce a mechanically firm junction of the inner leads to the semiconductor chip as well as to increase the degree of electrical coupling of the inner leads to the electrodes.

The above and other objects, features, and advantages of the invention will become more apparent from the following description when taken in conjunction with the accompanying drawings.

DESCRIPTION OF THE PREFERRED EMBODIMENT

First Embodiment

Figure 1:
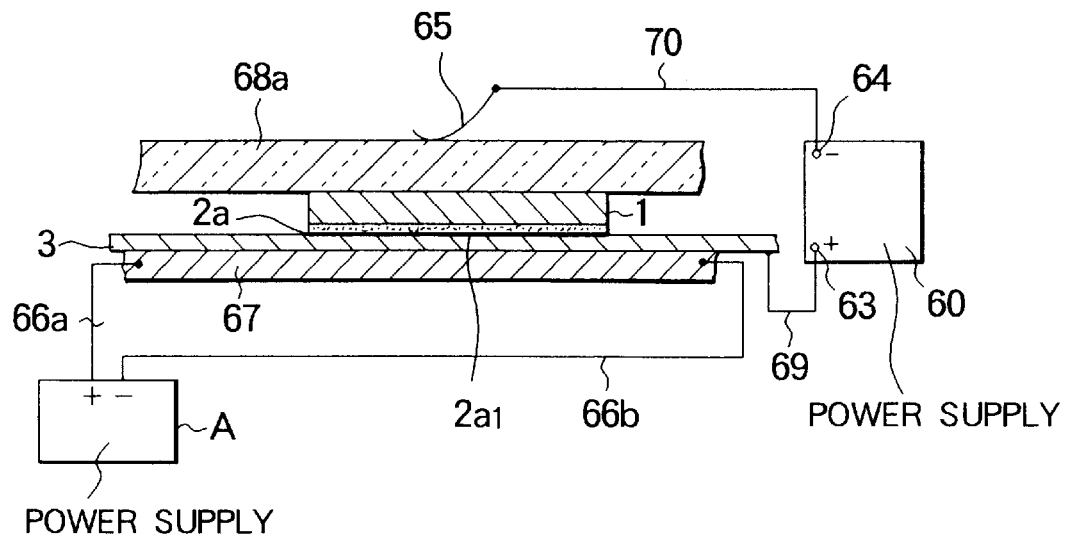
FIG. 1 is a cross-sectional view showing a semiconductor chip for describing an anodic bonding method according to an embodiment of the present invention.
Figure 42:
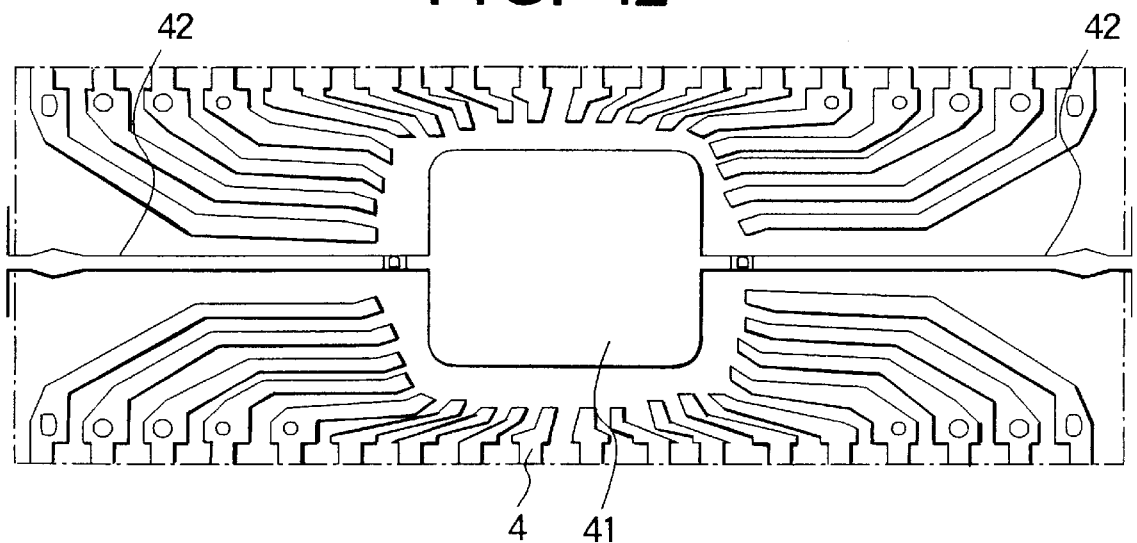
FIG. 42 is an enlarged plan view showing an inner lead section of a conventional lead frame.
Figure 56:
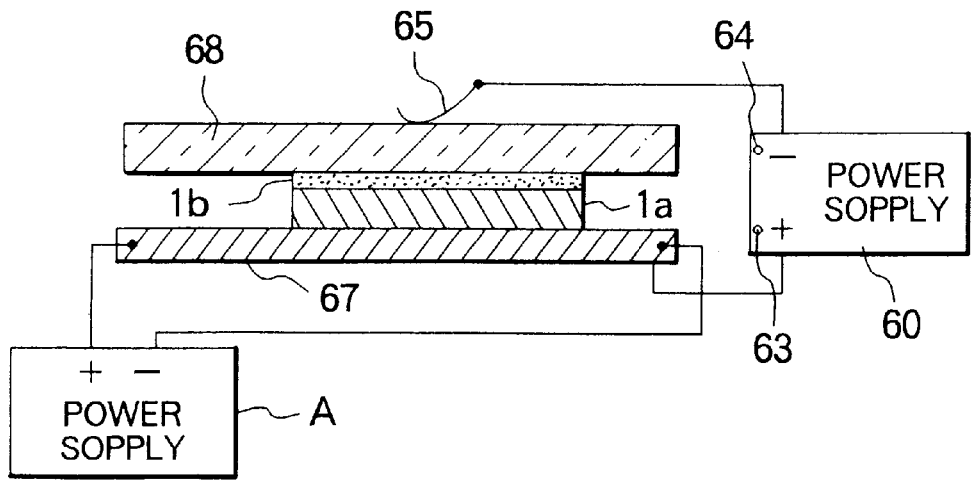
FIG. 56 is an illustration for describing anodic bonding.
Figure 57:
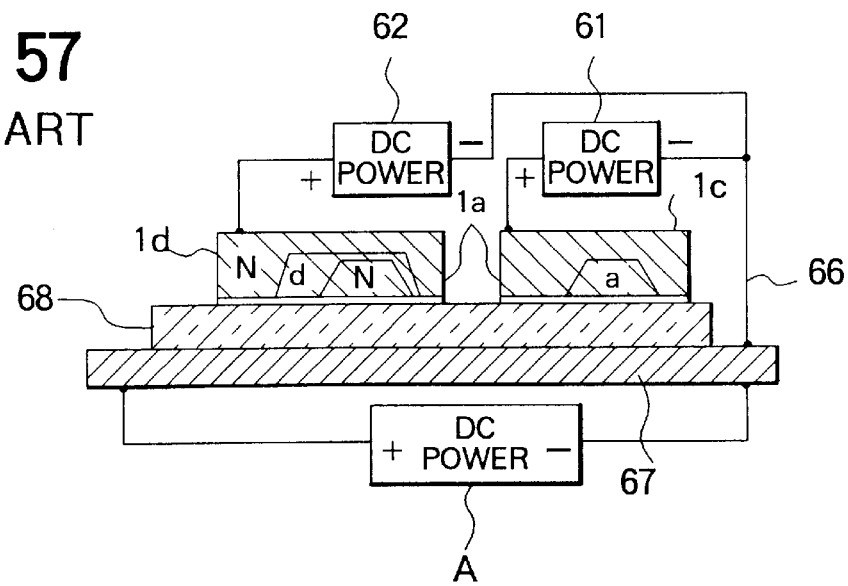
FIG. 57 is an illustration for describing another anodic bonding method.
Figure 58:
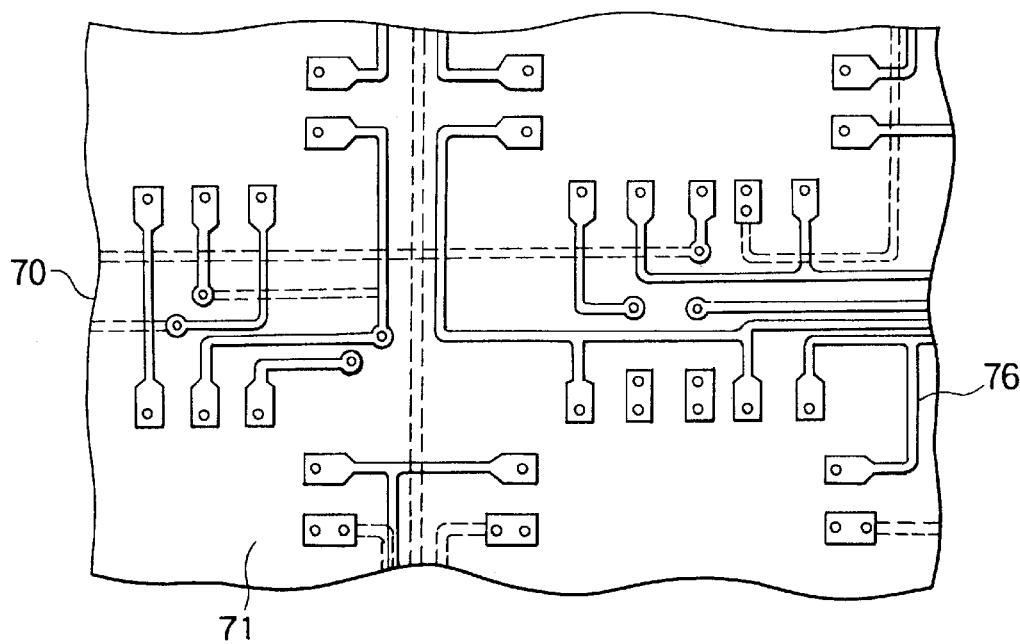
FIG. 58 is a plan view showing a conventional wiring substrate to be used for a laminated multi-layer substrate.
Figure 59:
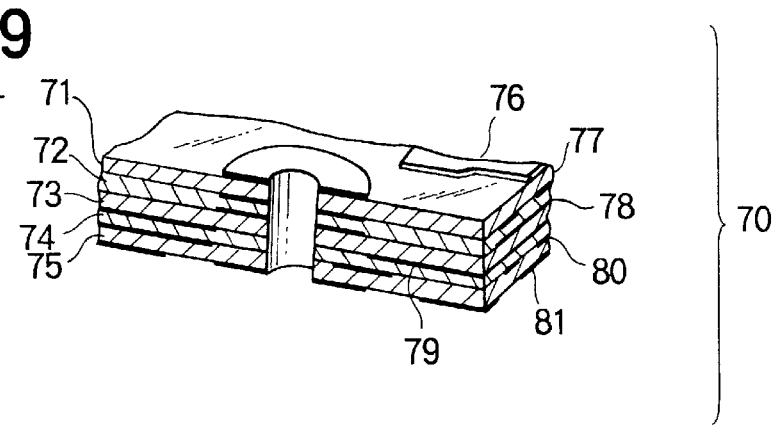
FIG. 59 is a cross-sectional view showing a conventional laminated multi-layer substrate.

FIG. 1 is a cross-sectional view of an anodic bonding means and semiconductor chip for describing a method of anodic bonding inner leads with respective electrodes of a semiconductor chip, where parts corresponding to those in FIG. 56 are marked with the same reference numerals. In the illustration, numeral 1 represents a semiconductor chip and numeral 2a designates an insulating coating made of a glass adhered to a portion of a surface of the semiconductor chip 1, other than the electrode portions, by means of sputtering, the insulating coating being electrically conductive when heated. It is preferable that a borosilicate glass (generally used for flasks, etc.) made of boric acid and silicic acid be used as the glass material. Since the coefficient of linear expansion of the boro-silicate glass is substantially equal to the coefficient of linear expansion of an electrical insulating film made of a silicon oxide and located on the semiconductor chip 1, the glass material is unlikely to peel off the electrical insulating film even when the insulating film cools. Further, numeral 3 denotes a lead frame having a configuration as shown in FIG. 42. In the case of the lead frame 3 in this embodiment, a die pad 41 and suspended leads 42 (indicated by broken lines), which have been needed for mounting the semiconductor chip, become unnecessary because the inner leads 4 are directly anodically bonded to the semiconductor chip 1. In FIG. 1, the semiconductor chip 1 is positioned at the central portion of the area in which the conventional die pad 41 is provided. In addition, each inner lead 4 extends to above each electrode of the semiconductor chip 1 as shown in FIG. 3.

Figure 3:
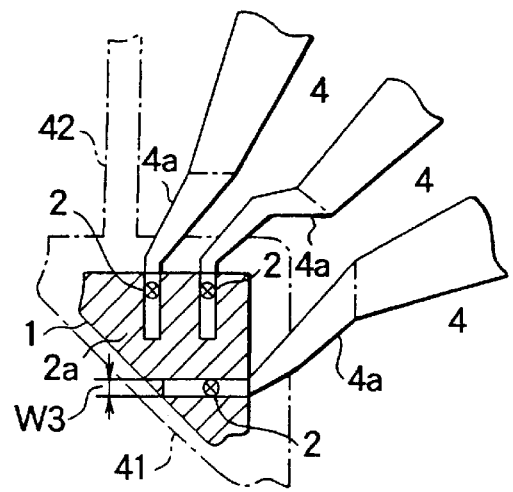
FIG. 3 is a plan view showing electrodes of a semiconductor chip joined with inner leads of a lead frame in accordance with a method according to this embodiment.

Furthermore, in FIG. 3, the positions of the tips of the conventional inner leads 4 are indicated by respective broken lines and inner leads 4a in this embodiment as the portions extending from the broken lines position. The tip of each of the inner leads 4a crosses over an electrode 2 on the top surface of the semiconductor chip 1. In the same illustration, the tip of each of the inner leads 4a is anodically bonded to the insulating coating 2a on the semiconductor chip 1, while the electrode 2 is pressed by the rear surface of the inner lead 4a to make an electrical connection therebetween. That is, when the inner lead 4a is joined with the insulating coating 2a, the joining surface of the inner lead 4a is pressed against the surface of the electrode 2, protruding several microns from the insulating coating 2a, thus making the electrical connection.

Figure 2:
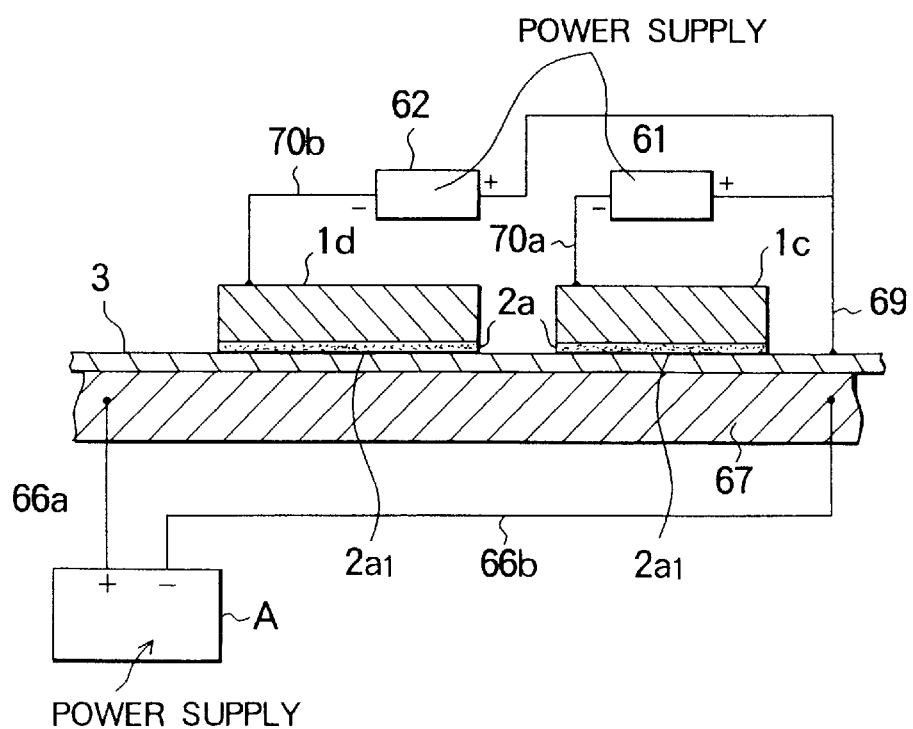
FIG. 2 is a cross-sectional view showing a semiconductor chip for describing an anodic bonding method according to an embodiment of the present invention.

With the structure of FIGS. 1 and 2, when a current from a power supply A flows through power leads 66a and 66b into a resistance heating plate 67, the resistance heating plate 67 heats, through the lead frame 3, the insulating coating 2a to approximately 400° C.±50° C., resulting in conduction of the insulating coating 2a. When a direct-current voltage is applied between the lead frame 3 and a positioning jig 68a, while conductively tied together through a direct-current power supply 60, a positive current flows between the insulating coating 2a and the lead frame 3. As a result, electrostatic adhesion and electrochemical bonding take place at the boundary plane 2a1 (indicated by a thick line under the insulating coating 2a) between the insulating coating 2a and the lead frame 3 so that the inner leads at the tip of the lead frame 3 are anodically bonded to the semiconductor chip surface.

For the electrical connection between the inner leads 3 and the electrodes 2 of the semiconductor chip 1, as shown in FIG. 3, the tip of the inner lead 4a is anodically bonded to the insulating coating 2a on the semiconductor chip 1, while the electrode 2 is pressed at the rear surface of the inner lead 4a to make the electrical connection therebetween. That is, when the inner lead 4a is joined with the insulating coating 2a, the joining surface of the inner lead 4a is pressed against the surface of the electrode 2, protruding several microns from the insulating coating 2a, thus making the electrical connection.

FIG. 2 is an illustration for describing a method of simultaneously anodically bonding a plurality of semiconductor chips 1 with a lead frame 3. In the illustration, numeral 61 represents a direct-current power supply for causing a positive current to flow into the insulating coating 2a of one semiconductor chip 1 and the lead frame 3, and numeral 62 designates a direct-current power supply for causing a positive current to flow into the insulating coating 2a of the other semiconductor chip 1 and the lead frame 3. In the illustration, the two semiconductor chips 1d and 1c are placed on the lead frame 3 and simultaneously anodically bonded thereto and, using the two direct-current power supplies 61 and 62, positive currents flow between the semiconductor chips 1d and 1c and the lead frame 3. In this case, if the semiconductor chips 1c and 1d can be accurately positioned relative to the lead frame 3 by some means, there is no need for a positioning jig 68a to be used as a pressing jig, positioning jig, and common short-circuit conductive element as shown in FIG. 1. In this method, it is possible merely to supply a positive current in a state in which the insulating coating 2a side is treated as a cathode and the lead frame 3, a metallic conductor, is treated as an anode. In addition, it is also appropriate that a positive potential be applied from direct-current power supplies so that a single or a plurality of collets (vacuum tweezers), not shown, for grasping the lead frame 3 can become an anode. In this case, using a single direct-current power supply is possible.

Figure 4:
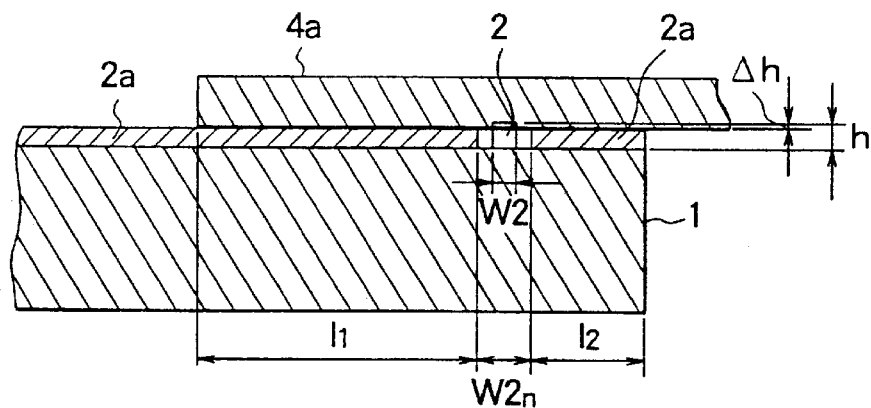
FIG. 4 is a cross-sectional view showing electrodes of a semiconductor chip joined with inner leads of a lead frame in accordance with a method according to this embodiment.

FIG. 4 is a cross-sectional view of a semiconductor chip 1 showing a portion to be anodically bonded, the central portion of the inner lead 4a having a width W3 in FIG. 3, cut away longitudinally. In FIG. 4, numeral 2 depicts a rectangular parallelepiped electrode having a width W2 and a height h. Around this electrode 2 there is a square opening section having a side W2n. The insulating coating 2a is adhered to a portion other than this opening section on the semiconductor chip 1. Accordingly, a gap of W2n–W2 is produced between the electrode 2 and the insulating coating 2a. A dotted line denotes a vertical dimension of the electrode 2 before being pressed and deformed by the inner lead 4a at the anodic junction, the top protruding by Δh from the insulating coating 2a surface. Accordingly, the insulating coating 2a has a thickness of (h–Δh).

Furthermore, when the anodic bond is completed and the electrode 2 is pressed, the electrode 2, as shown by a solid line in FIG. 4, has a height of (h–Δh). When being pressed, the electrode 2 is crushed so that its transverse dimension naturally becomes wider, while, since a space W2n–W2 exists between the electrode 2 and the insulating coating 2a, the increase in this dimension does not affect the insulating coating 2a. However, when the electrode 2 is actually pressed so that a compression strain of Δh/h occurs, the increased width ΔW of the electrode 2 is ΔW=v×(Δh/h). The Poisson ratio v of the electrode 2 is on the order of approximately 0.3, so that, if the increasing width ΔW can be treated at the design stage so that it can be disregarded, it will be possible to set W2n=W2. In fact, the portion at which the inner lead 4a and the insulating coating 2a are anodically bonded to each other is in the range of the anodic bonding areas 11 and 12 between which the opening section with the width W2n is interposed.

Figure 5:
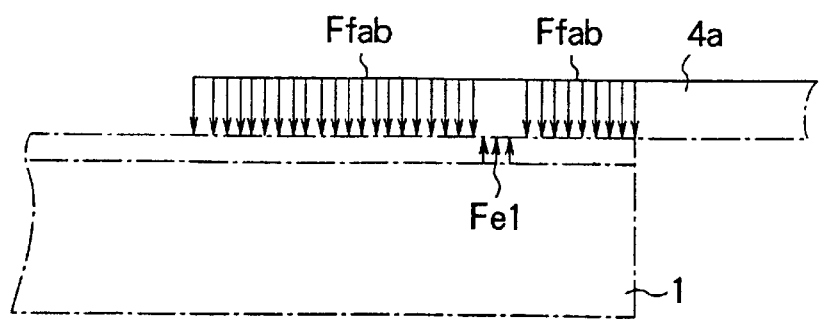
FIG. 5 is a cross-sectional view of a semiconductor chip for describing a distribution of a load applied from an inner lead to a semiconductor chip surface at a junction.

Next, a detailed description will be given with reference to FIG. 5 in regard to the anodic bonding force produced in the areas 11 and 12 and the reaction force generated in the electrode 2. FIG. 5 is an illustration for describing the relationship between the anodic bonding force Ffab applied against the insulating coating 2a and the reaction force Fel from the electrode 2. The electrode 2 is designed so that the magnitude of the anodic bonding force Ffab is larger than the reaction force Fel produced as a reaction due to the electrode compression (Ffab>Fel), where the reaction force Fel is always the static simple compression.

Furthermore, since the areas 11 and 12 are not equal to each other, although in FIG. 5 the reaction force Fel is not illustrated as occurring at the center of the total force Ffab, ideally it is desirable that Fel occur at the center of Ffab, that is, the electrode 2 is at the center of the bonding portion of the inner lead 4a. If design permits the electrode 2 to be subjected to a moment and compression, the Fel can be applied at a location other than the center of Ffab.

When anodically bonded, the reaction force Fel in the electrode 2 is expressed as Fel=E×($\Delta$h/h)×W2×W2 which is proportional to $\Delta$h/h where E represents an elastic modulus (Young's modulus) depending upon the physical properties of the material of the electrode 2.

The force Ffab is the actually a measured result of the tensile breaking strength of the junction when a boro-silicate glass is the insulating coating 2a bonded to silicon. The boro-silicate glass and silicon are strongly bonded to each other to the extent that the glass base material is broken. The bonding strength is considered $\sigma$fab$\geq$4 kgf/mm$^2$, and the bonding force Ffab due to the bond is {W3×(l1+W2n+l2)−W2n×W2n}×$\sigma$fab. Now, considering the ratio Ffab/Fel of the bonding force to the reaction force, this value must become greater than 1. The ratio Ffab/Fel can be expressed in accordance with the following equation.

$$\text{Ffab/Fel}=[\sigma\text{fab}\times\{W3\times(l1+W2n+l2)W2n\times W2n\}]/[6300\times(\Delta h)\times W2\times W2] \quad (1)$$

When aluminum is employed as the material of the electrode 2, if E=6300 kgf/mm$^2$, Ffab/Fel can be expressed by the following equation.

$$\text{Ffab/Fel}=[4\times\{W3\times(l1+W2n+l2)-W2n\times W2n\}]/[6300\times(\Delta h)\times W2\times W2] \quad (2)$$

Since the breaking strength of the electrode 2 is 7 kgf/mm$^2$, if the displacement of the electrode 2 is limited to the plastic deformation region when the electrode 2 is subjected to a compressing force, $\Delta$h/h is less than 1.1×10$^{-3}$. Accordingly, the breaking strength is doubled to give some allowance, and when the dimension of each part is determined as $\Delta$h/h=5×10$^{-4}$, Ffab/Fel is given as follows.

$$\text{Ffab/Fel}=1.27\times\{W3\times(l1+W2n+l2)-W2n\times W2n\}/\{W2\times W2\} \quad (3)$$

Since W3$\geq$W2n$\geq$W2, if W3, W2n and W2 are almost equal to each other, the minimum Ffab/Fel can be obtained from the following equation.

$$\text{Ffab/Fel}=[1.27\times\{(l1+W2n+l2)/W2\}-1\}]>1 \quad (4)$$

Accordingly, the only requirement is that the above-mentioned condition be satisfied. As shown in FIG. 4, it is possible for (l1+W2n+l2) to be greater than W2.

In this embodiment, W3, l1+l2+W2n, and W2 are determined to satisfy the above-mentioned condition. When, in an aluminum electrode, $\Delta$h/h is set to 5×10$^{-4}$ from the relation of (W2n−W2)/W2$\geq$v×$\Delta$h/h, there results W2n>1.000165W2=W2+1.65×10$^{-4}$×W2 from v=0.33. When W2n is set to be greater than W2, the dimension of W2n becomes 1.65×10$^{-4}$ times W2, and hence the only requirement is that the opening section be formed to have a dimension smaller than the dimension of the electrode 2.

Employing $\Delta$h/h=5×10$^{-4}$, the thickness of the insulating coating 2a needs to be h−$\Delta$h=0.9995×h. Generally, when the thickness of the insulating coating 2a is set to 25 $\mu$m, the design is satisfactory when the height of the electrode is set to h=25.0125 $\mu$m, and it is higher by 125 Angstroms than the height of the insulating coating 2a.

As described above, $\Delta$h/h is designed to be within the plastic deformation region of the material of the electrode 2 and the dimension is determined so that $\Delta$h/h=5×10$^{-4}$. Accordingly, since the difference between the heights of the insulating coating and the electrode is as small as 25×5×10$^{-4}$, the height of the electrode 2 must be accurate.

Figure 6A:
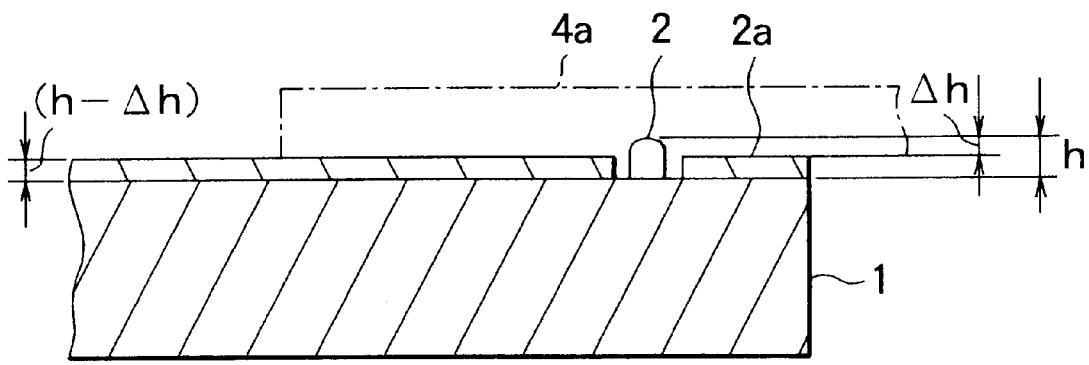
FIGS. 6A and 6B are cross-sectional views of semiconductor chips showing the configuration of an electrode on a semiconductor chip.
Figure 6B:
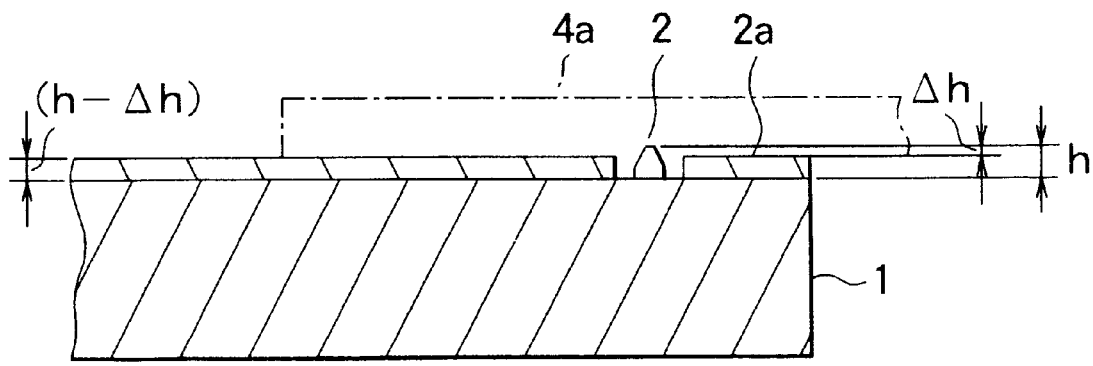
Figure 7A:
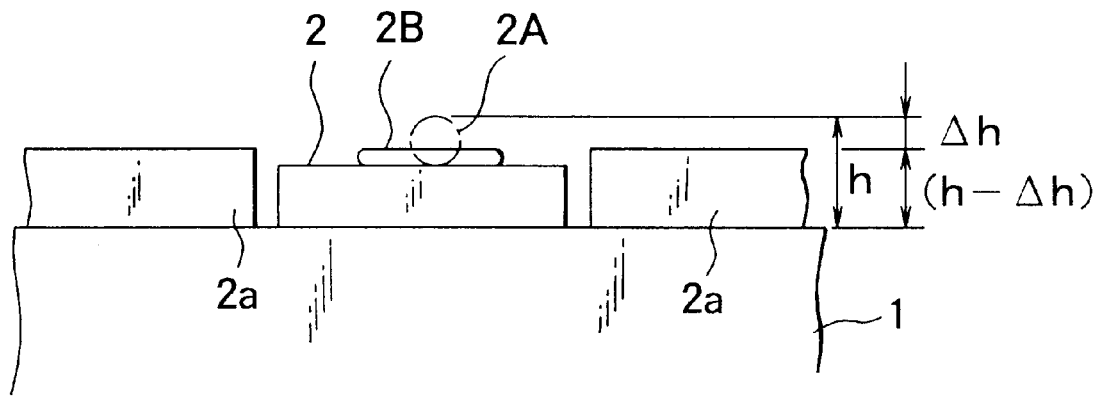
FIGS. 7A and 7B are cross-sectional views of semiconductor chips showing a configuration of a conductive material placed between an inner lead and an electrode and further showing a configuration after deformation.
Figure 7B:
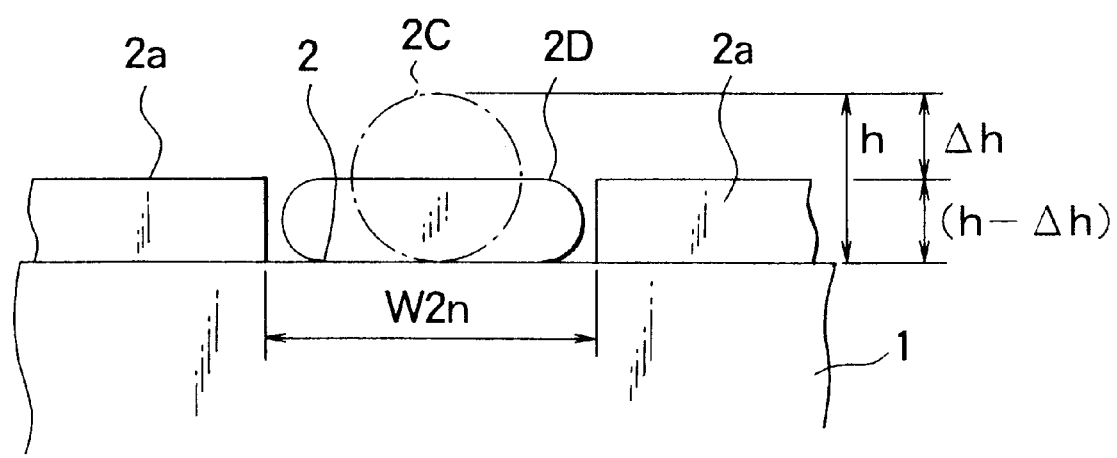

When an electrode 2 exceeding the plastic deformation region is used, since the height of the electrode is adjustable by reducing precision during manufacture, the contact surface of the electrode 2 may have a spheroidal configuration as shown in FIG. 6A or a trapezoidal shape as shown in FIG. 6B. Further, it is also appropriate that, as shown in FIGS. 7A, 7B, and 8, a spheroidal soft conductor (for example, solder) is placed on the electrode surface so that the inner lead and the electrode are electrically connected to each other through the soft conductor.

Figure 8:
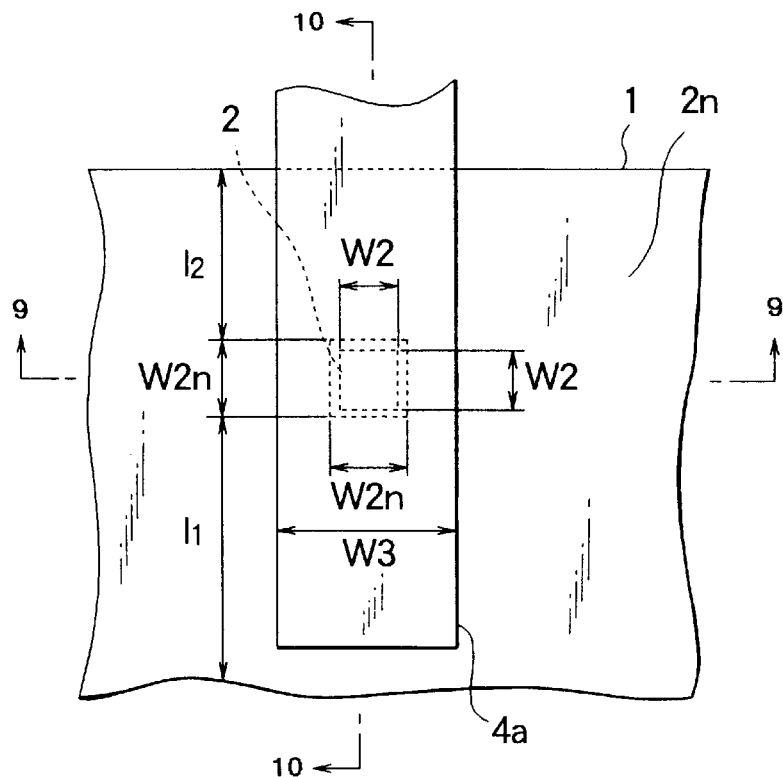
FIG. 8 is a plan view of a semiconductor chip for explaining a joining state between an inner lead and an electrode according to this embodiment.

FIG. 8 is an plan view of the semiconductor chip 1 in the case that W3>W2 so that Ffab/Fel from the following equation is 1 or more.

$$\text{Ffab/Fel}=1.27\times\{W3\times(l1+W2n+l2)-W2n\times W2n\}/\{W2\times W2\} \quad (5)$$

Figure 9:
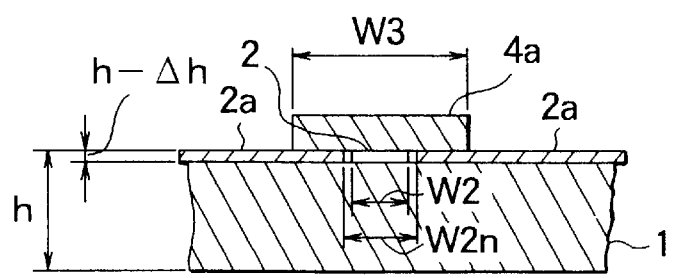
FIG. 9 is a cross-sectional view taken along line 9—9 in FIG. 8.
Figure 10:
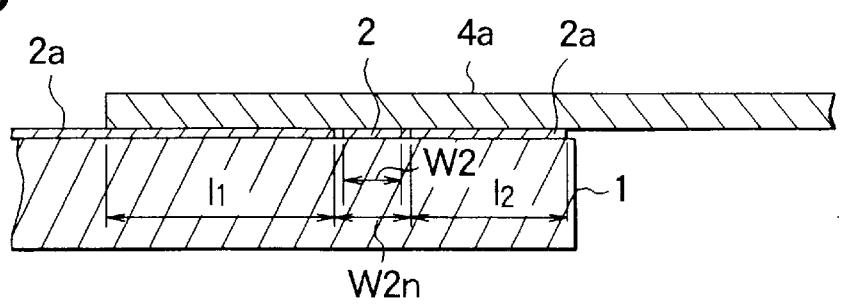
FIG. 10 is a cross-sectional view taken along line 10—10 in FIG. 8.

For increasing the value of Ffab/Fel, it is effective that W2 is as small as possible and W3 is as large as possible. FIG. 9 is a cross-sectional view taken along line 9—9 in FIG. 8 and FIG. 10 is a cross-sectional view taken along line 10—10 in FIG. 8. Although in FIGS. 8 to 10 the center of the inner lead 4a in the longitudinal direction is coincident with the junction center of the electrode 2 on the semiconductor chip 1 surface in the anodic bonding process, in the assembly process it is necessary to take the variations of the central line 10—10 and the central line 9—9 into consideration. The dimension of each part is determined taking into account the fact that the electrode 2 can not deviate from the anodic bonding range of the inner lead 4a even if assembly errors take place. In FIGS. 8 to 10, Ffab and Fel are obtained under the condition that the dimension of one side of the electrode 2 is taken as W2=50 $\mu$m, the dimension of one side of the opening section is taken to be W2n=51 $\mu$m, the thickness of the insulating coating 2a is h−$\Delta$h=25 $\mu$m, the width of the inner lead 4a is W3=300 $\mu$m, the dimension of one anodic bonding area is l2=400 $\mu$m, and the dimension of the other anodic bonding area is l1=400 $\mu$m.

As a result, the anodic bonding force Ffab=1.01 kgf and the reaction force Fel due to the electrode compression equals Fel=7.88 gf. At this time, the surface pressure on the contact surface of the electrode 2 is 3.15 kgf/mm$^2$, which may be satisfactory in obtaining the electrical conduction. Moreover, this results in Ffab/Fel=128.2, thus making possible a sufficient functioning force. Although in FIG. 10 the anodic bonding section lengths l2 and l1 are different from each other and there is only one electrode 2, it is naturally possible to use a plurality of electrodes.

Figure 11:
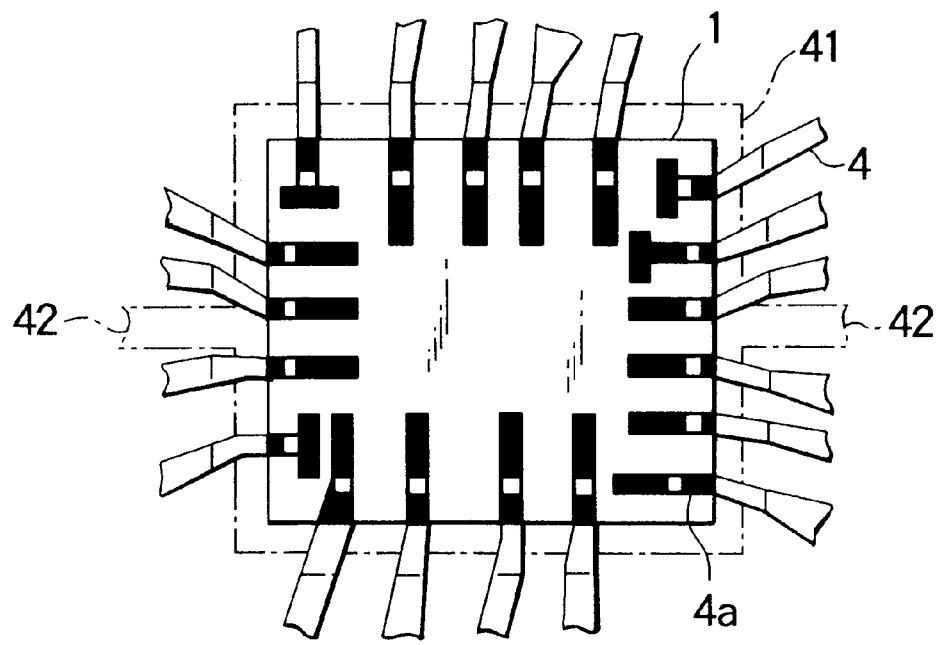
FIG. 11 is a plan view of a semiconductor chip showing an inner lead anodically bonded to the semiconductor chip according to this embodiment.
Figure 49:
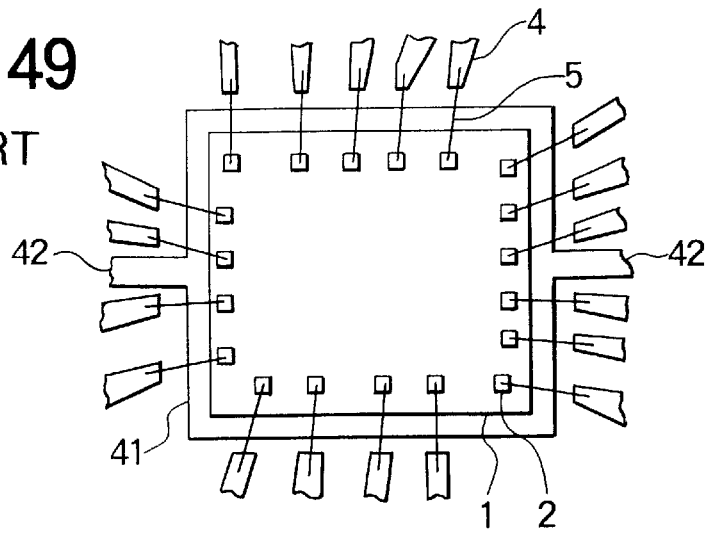
FIG. 49 is a plan view of a semiconductor chip showing a joining state between an inner lead and electrode.
Figure 50:
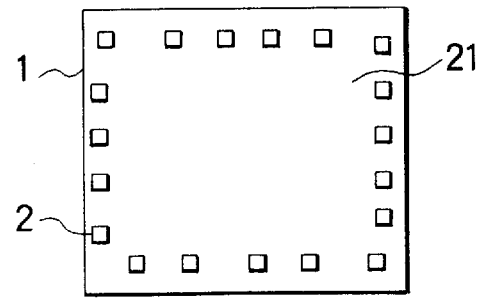
FIG. 50 is a plan view of a semiconductor chip showing an arrangement of electrodes on a semiconductor chip.

FIG. 11 is a plan view of a semiconductor chip viewed from the upper side showing a state in which inner leads 4a and the semiconductor chip 1 are joined to each other by anodic bonding. As is obvious from this illustration, the tip of the inner leads 4a extends and crosses over the electrode 2 on the surface of the semiconductor chip 2. Further, the anodic bond is made at the tip of the inner lead 4a. In comparison with the junction between the inner lead 4 and the semiconductor chip 2 arising from the conventional wire bonding, as shown in FIG. 49, it is easily understood that the anodic bonding method according to this embodiment does not require the gold wire 5, die pad 41, or suspended lead 42.

Figure 12:
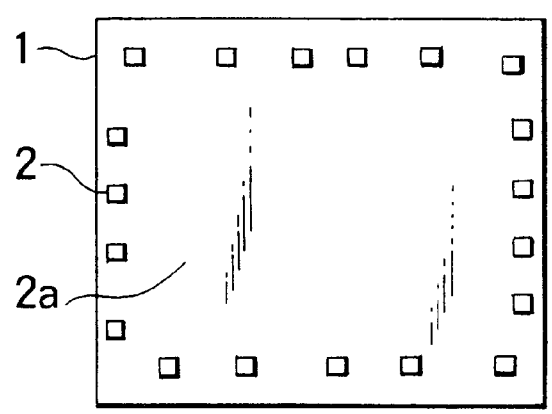
FIG. 12 is a plan view of a semiconductor chip showing an arrangement of electrodes on the semiconductor chip according to this embodiment.

FIG. 12 illustrates the electrodes 2 on the semiconductor 1 surface and the insulating coating 2a in which openings are located around the electrodes 2. It is to be noted that the whole surface of the semiconductor chip 1 on which the insulating coating 2a is present is an anodically bondable area, and it is possible to use even the bondable area freely with no insulating coating 2a required.

Second Embodiment

Although in the first embodiment the contact surface of the electrode 2 with the inner lead 4a has a spheroidal or trapezoidal configuration, the configuration of the electrode 2 contact surface can take a pyramidal configuration or variable configurations made by using side etching during formation as long as the conditions described above are implemented. The only requirement is that the electrical contact area between the inner lead 4a and the electrode 2 assume at least a necessary minimum value when the anodic bond is completed. For example, as shown in FIG. 6B, the contact portion of the electrode 2 to be crushed by the junction would deform to exceed the plastic region as indicated by a dotted line. However, this result is satisfactory as long as there is electrical conduction therebetween.

If the selection of the material of the electrode 2 is made properly, even if the electrode 2 is subjected to plastic deformation, it is possible to maintain normally the electrical connection between the electrode 2 and the inner lead 4a. Even in the worst case, a stable junction is obtainable as compared with the wire bonding method in which the gold wire 5 is melted and the melted gold wire 5 is re-joined with the aluminum electrode. The reason is that the mechanical junction between the inner lead 4a and portions other than the electrode 2 can be made with sufficient strength because of the anodic bond.

Third Embodiment

Although in the first embodiment the contact surface of the electrode 2 has a spheroidal or trapezoidal configuration, in order to secure a large crushed amount $\Delta h$ between the insulating coating 2a and the electrode 2, it is effective to provide a conductive small ball (sphere) 2A made of gold, solder, or the like which has a low elastic modulus on the electrode 2, as shown in FIG. 7A. In the illustration, reference numeral 2B indicates a state in which the small ball 2A is crushed by an inner lead, not shown, during anodic bonding so that the inner lead and the electrode 2 are bonded to each other to make a connection therebetween.

In FIG. 7A, the electrode 2 protrudes from the silicon substrate at an opening in the insulating coating 2a, while in FIG. 7B, the electrode 2 is exposed from the silicon substrate surface and positioned lower by (h–$\Delta h$) than the insulating coating 2a surface, with the result that a sphere 2C having a diameter greater than that of the conductive small ball 2A in Fib. 7A by the thickness of the electrode 2a can be fitted in the opening section. Assuming that a configuration 2D of the crushed sphere 2C is a cylinder having a radius R and height (h–$\Delta h$), the relationship to the conductive ball $\sigma$ can be expressed by the following equation.

If the radius r of the small sphere 2C is equal to the thickness (h–$\Delta h$) of the insulating coating 2a, the radius R of the configuration 2D of the crushed small sphere 2C becomes R=1.155r. That is, the fitted small sphere 2C having a radius r is larger by only 15.5% in radius when being crushed. Thus, the thickness (h–$\Delta h$) of the insulating coating 2a can be produced without improving manufacturing accuracy.

Furthermore, the dimension W2n of the electrode opening section of the insulating coating 2a need only to be larger than the radius R of the small sphere, and the variation in the radius R of the configuration 2D can be found on the basis of the radius r of the ball 2C and the thickness (h–$\Delta h$) of the insulating coating 2a. That is, $$(4/3)\pi r^3 = (h-\Delta h) \times \pi \times R^2 \tag{A}$$

differentiating both sides of equation (A), $$4\pi r^2 \times \Delta r = 2\pi(h-\Delta h)R \times \Delta R + \pi \times R^2 \times \Delta(h-\Delta h) \tag{B}$$

Thus, the following equation (C) can be given by taking the ratio of (B) and (A), $$1/3 \times \Delta r/r = 2 \times \Delta R/R + \Delta(h-\Delta h)/(h-\Delta h) \tag{C}$$

from (C), $$\Delta R/R = 1/2 \times \{1/3 \times \Delta r/r - \{\Delta(h-\Delta h)/(h-\Delta h)\} \tag{D}$$

The rate of change of the radius of a surface to be electrically joined can be expressed by the right side of (D), obtained by developing equation (C). That is, when $\Delta r/r = \pm 10\%$ and $\Delta(h-\Delta h)/(h-\Delta h) = \pm 10\%$, $\Delta R/R$ is only changed by 6.7%, which allows an electrical connection with high accuracy. In other words, even if the manufacturing tolerance of the small sphere 2C and the insulating coating 2a are respectively 10%, the error in the radius of the portion to be used for the electrical connection after crushing is as small as 6.7%.

In equation (A), the volume of the small sphere is given as $(4/3)\pi r^3 = 2V_{Ball}$, and $V_{Ball}/\pi \times (h-\Delta h) = R^2$. When the volume of the small sphere varies and the dimension (h–$\Delta h$) of the insulating coating includes an error, $\Delta R/R$ is expressed by the following equation.

$$\Delta R/R = 1/2\pi \times \{\Delta V_{Ball}/V_{Ball} - \{\Delta(h-\Delta h)/(h-\Delta h)\} \tag{D}$$

Accordingly, even if the small sphere $V_{Ball}$ does not have a true spherical configuration, as long as it is a conductive inclusion with the necessary volume, it may be a bump, laminated electrode, or conductive material protruding from the lead frame toward the electrode 2 according to this embodiment. The point is that a conductive material substituting for the small sphere $V_{Ball}$ be fitted between the electrode 2 and the inner lead 4a. This can offer the same effect.

Although a description has been made with reference to FIGS. 6A to 7B in terms of an electrode 2 with ideal dimensions, when actually anodically bonded, the reaction force Fel of the electrode 2 is large, and if the electrode 2 is not crushed $\Delta h$ by means of the inner lead 4a, a non-bonded portion can appear in the anodically bonded area. However, when the area for the anodic bond is sufficiently wide, even if a non-bonded portion is present near the electrode 2, the bonded portion can maintain the mechanical strength between the inner lead 4a and the semiconductor chip 1. In this case, $\Delta h$ can be set in an ordinary way without taking the precision of $\Delta h$ into consideration.

Fourth Embodiment

Although the conductive inclusion for the electrode section has been described above as being a small sphere 2A or 2C having a completely spherical configuration, as illustrated in FIGS. 7A and 7B, if the condition mentioned in the third embodiment is satisfied, an irregularly configured body such as a rectangular parallelepiped and cube can produce the same effect. Further, the material of the irregularly configured body can be an easily deformed material, such as aluminum, solder, and gold or a liquid conductive material, such as mercury, and a conductive resin. However, when the material of the semiconductor chip is silicon or GaAs, the semiconductor chip will be broken if the conductive inclusion is a material having an elastic modulus higher than that of such materials, for which reason it is preferable that the conductive inclusion be made of a material having an elastic modulus lower than that of the material of the semiconductor chip. In addition, it is also possible to use a conductive resin or the like other than a metal. In this case, it is undesirable to use a material which, when crushed, is deformed so that its dimension exceeds the dimension W2n of the opening section in the insulating coating 2a.

Figure 13:
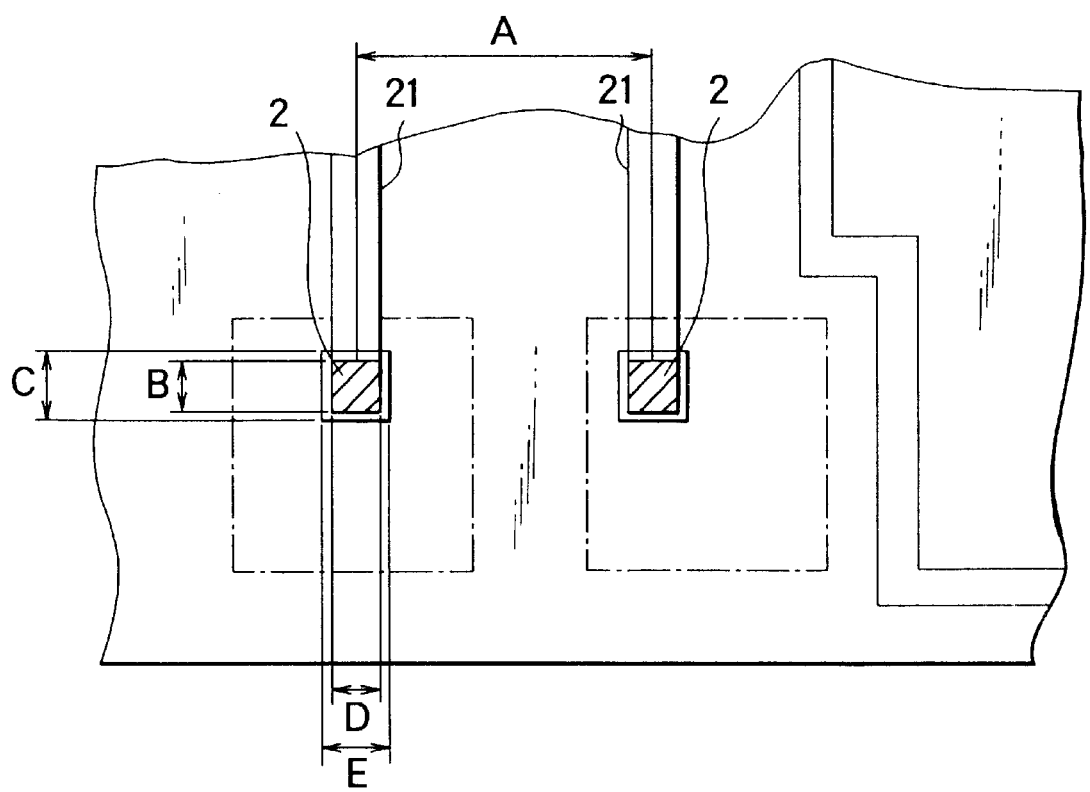
FIG. 13 is a partially enlarged view of a semiconductor chip for a detailed description of an electrode joining portion in FIG. 11.
Figure 51:
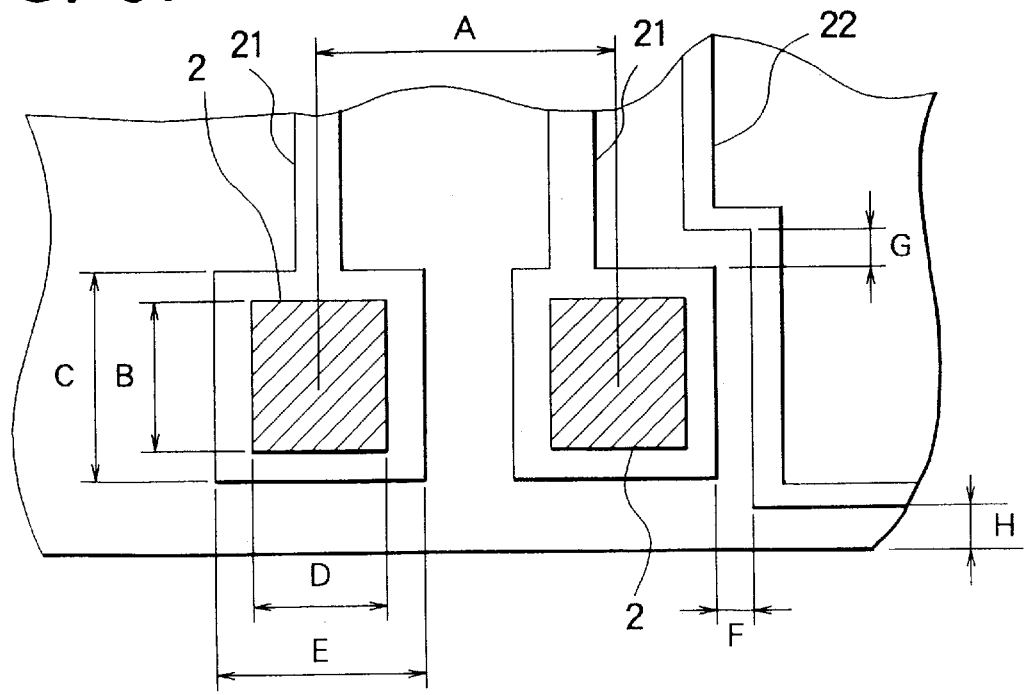
FIG. 51 is a plan view of a semiconductor chip showing arrangement and dimensions of electrodes on a semiconductor chip.
Figure 52:
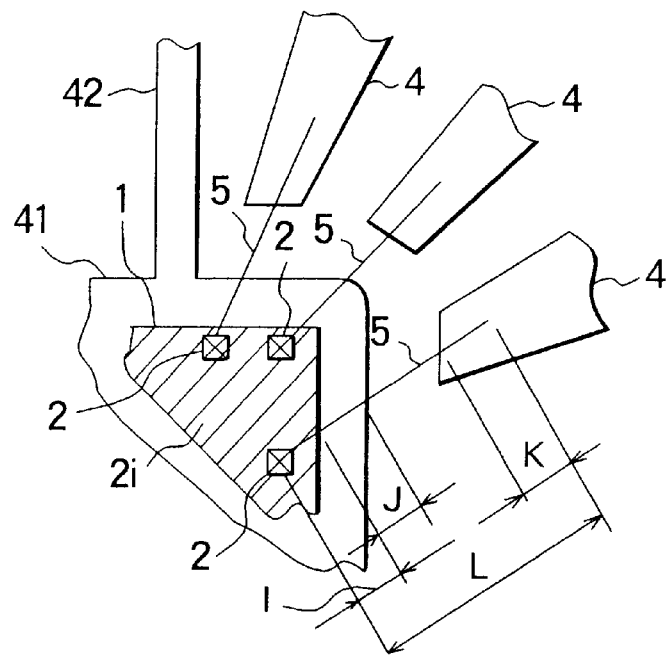
FIG. 52 is a plan view showing relative dimensions among an electrode, gold wire, and inner lead.
Figure 53:
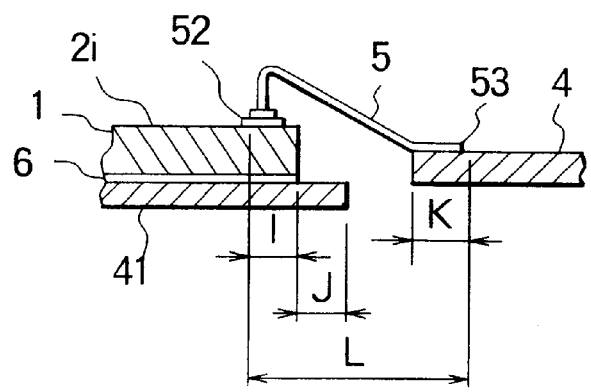
FIG. 53 is a side elevational view showing a gold wire of FIG. 52.

FIG. 13 is a partially enlarged view of the semiconductor chip 1 surface for describing the fact that, when the bonding method according to this embodiment is employed, the pitch of the adjacent electrodes 2, which has been determined depending upon the dimensions of the electrodes 2, can be made smaller to allow the chip to be made smaller. A description will be given in terms of the dimension A between wiring conductors 21 in FIG. 13 and the dimension A in FIG. 51 resulting from the conventional junction method. In FIG. 51, the pitch A of the electrode 2 depends upon the dimension D of the electrode 2 and the dimension E of the opening section. On the other hand, if the inner lead 4a and the semiconductor chip 1 are joined with each other according to this embodiment, the dimensions B and D of the electrode 2 and the dimensions C and E of the opening section indicated in FIG. 13 can be made smaller. This results from the fact that the dimension A between the inner leads 4a can be significantly reduced. Since reducing the dimensions B and D is possible, the electrode 2 requires only a minimum area for the electrical junction, and there is no need for a large area to enhance the mechanical bond with the inner lead 4a.

The relationship between the area of the electrodes 2 and the anodic bonding area of all the inner leads will be described with reference to FIGS. 13, 8, and 12. In FIG. 12, the area of the insulating coating 2a to be anodically bonded on the semiconductor chip is {W3×(l1+W2n+l2)−W2n×W2n} when using dimensions 11, 12, W3, W2n, and W2 shown in FIG. 8. The number of anodic bonding areas is nineteen, corresponding to the number of the electrodes 2, and hence the total area of the insulating coating 2a to be anodically bonded is 19×{W3×(l1+W2n+l2)−W2n×W2n}. The area of each of the electrodes 2 is 19×W2n×W2n, and, if the area of the electrodes 2 is reduced, the area of the anodic bonding becomes larger, and the mechanical junctioning force Ffab also becomes larger. The dimension W2n determining the area of the electrode 2 is equivalent to the dimension D shown in FIG. 13 and, therefore, as the dimension becomes smaller, the dimension A can be reduced. Accordingly, reducing the dimension W2n or D is the most important factor in reducing the size of the semiconductor chip and achieving the purpose of enhancing the mechanical bonding force, Ffab.

Fifth Embodiment

Figure 14A:
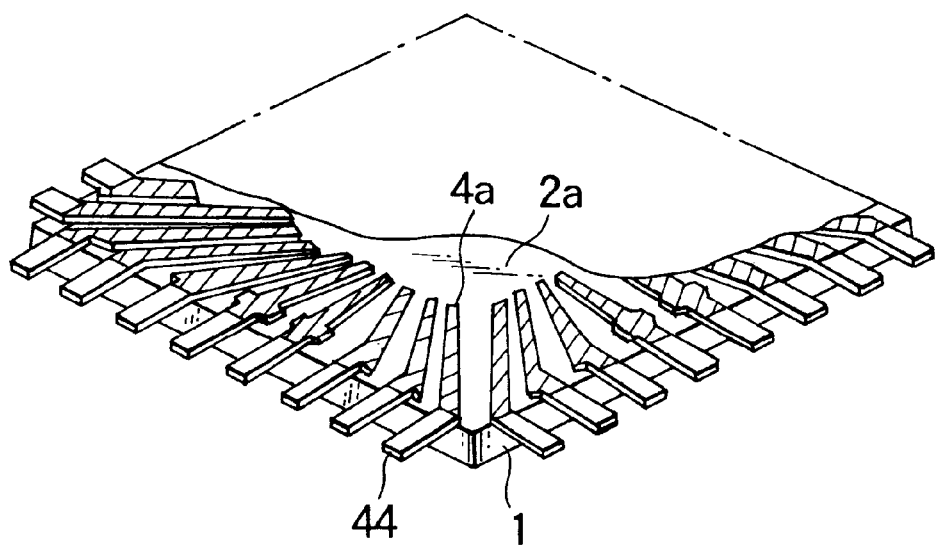
FIGS. 14A and 14B are perspective views showing QFP and SOP semiconductor devices in which an electrode and inner lead are joined to each other by anodic bonding.
Figure 14B:
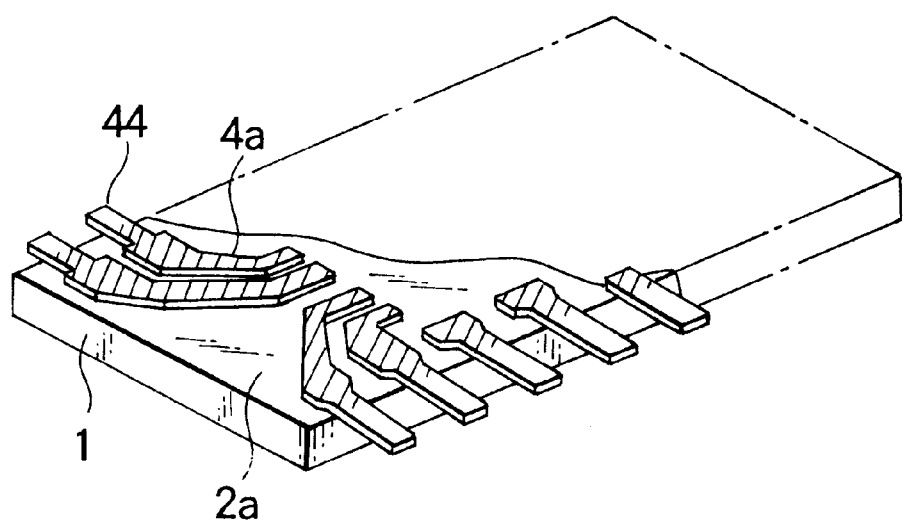

FIG. 14A illustrates a semiconductor device constructed without using a molded resin and shows a QFP package. Similarly, FIG. 14B illustrates a semiconductor device constructed with no molded resin and shows a QFP package. In these illustrations, broken lines indicate a molded resin if required to protect the semiconductor chip 1 against the external environment. With the semiconductor device being manufactured using anodic bonding, the inner lead 4a can be directly joined with the surface of the semiconductor chip 1 and fixed thereonto and the tip of the inner lead 4a can be pressed against the electrode to make an electrical junction, and, hence, unlike the semiconductor device manufactured using the conventional wire bonding method, a molded resin is unnecessary for protecting the gold wire 5 portion and for fixing the inner lead 4. In addition, since external leads 44 can be directly bent downwardly at the edge of the semiconductor chip 1, the configuration of the semiconductor device can be reduced by the size of the unnecessary molded resin.

Figure 15A:
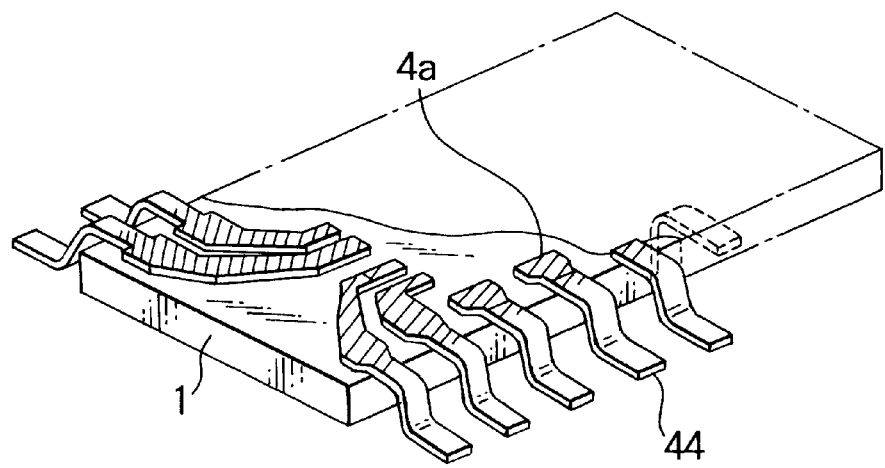
FIGS. 15A and 15B are perspective views showing another semiconductor device manufactured with an electrode and inner lead joined to each other by anodic bonding.
Figure 15B:
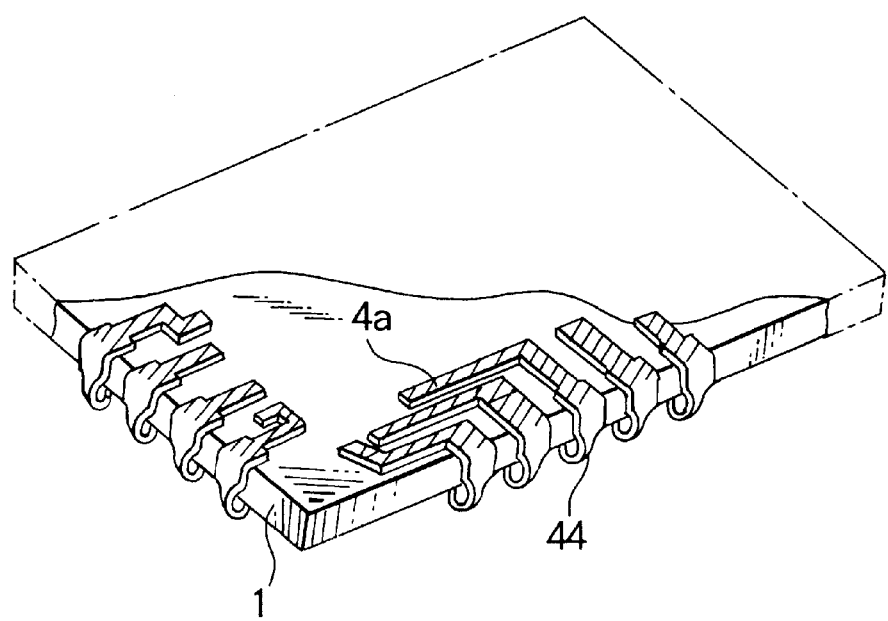

FIG. 15A shows a SOP (small outline package) I. In FIG. 15A, external leads 44 have a gull-wing shape so that a semiconductor chip 1 is mounted on a substrate in a face-up state. It is also appropriate that the external leads 44 be bent upwardly as indicated by dotted lines to take another gull-wing shape so that the semiconductor chip 1 is mounted in the face-down position. FIG. 15B illustrates J-bent leads 44 where the external leads 44 are bent downwardly along the edge of the semiconductor chip 1. In the same illustration, it is also possible that the J-bent external leads 44 be bent in the opposite direction, like the gull-wing configuration.

Figure 16A:
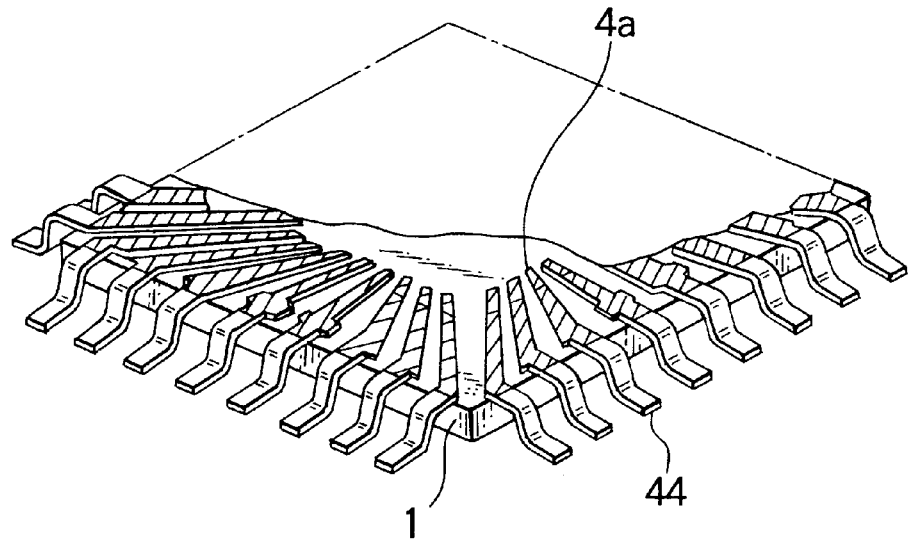
FIGS. 16A and 16B are perspective views showing a modification of a QFP semiconductor device manufactured with an electrode and inner lead joined to each other by anodic bonding.
Figure 16B:
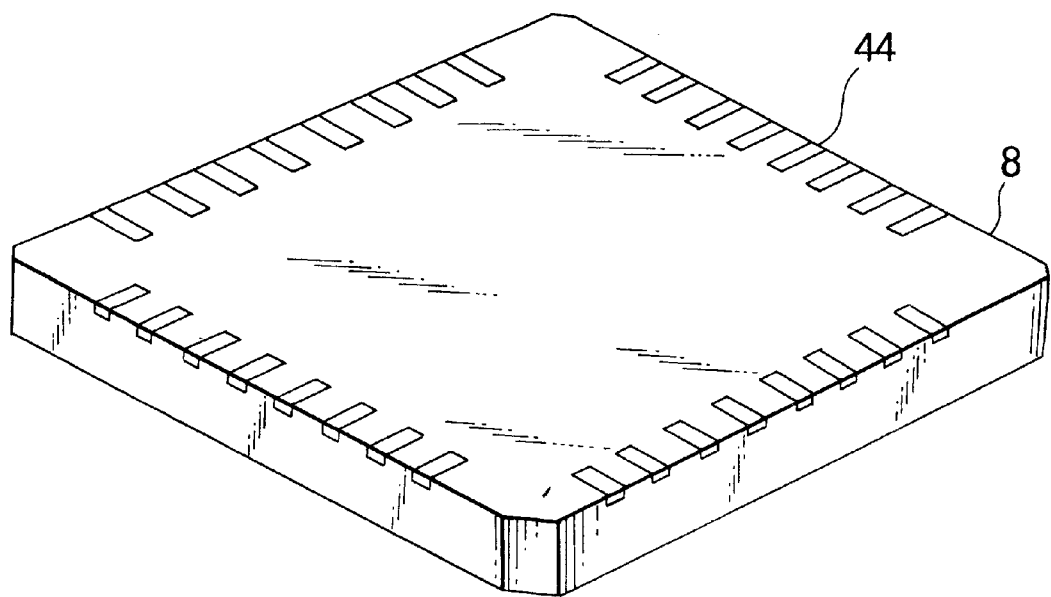

FIG. 16A illustrates a QFP package having gull-wing external leads 44, the QFP package being mounted in a face-up position. Although omitted in the illustration, SIP (single inline package) and DIP (dual inline package) are also applicable. FIG. 16B shows a state of molding with a molded resin 8 to the tip of the external leads 44 shown in FIG. 16A. The outer packaging of molded resin 8 improves a degree of planarity of the external leads 44.

Figure 17:
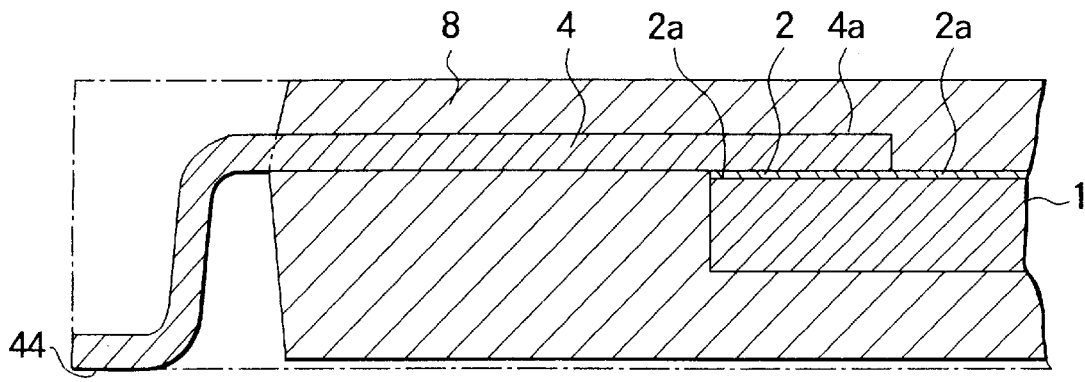
FIG. 17 is an enlarged cross-sectional view of a semiconductor device showing a joining portion between an electrode and inner lead of the semiconductor device manufactured by anodic bonding.
Figure 43:
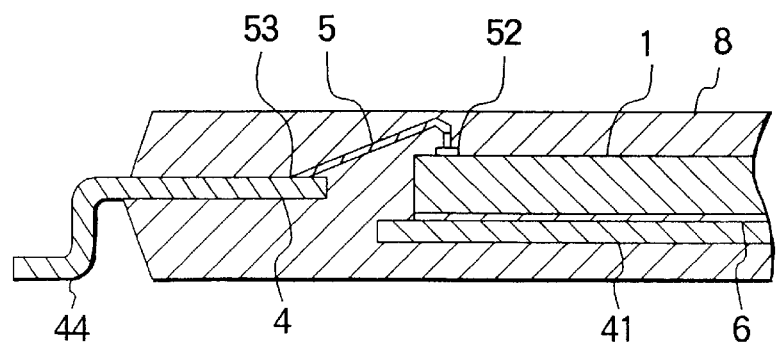
FIG. 43 is a cross-sectional view showing a portion of a semiconductor device manufactured by wire bonding.
Figure 44:
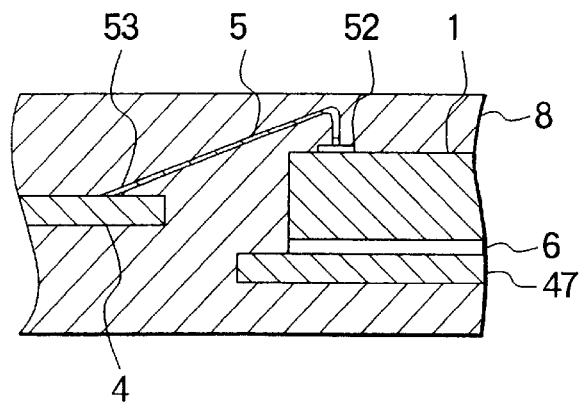
FIG. 44 is an enlarged cross-sectional view showing a wire bonded portion of FIG. 43.
Figure 45:
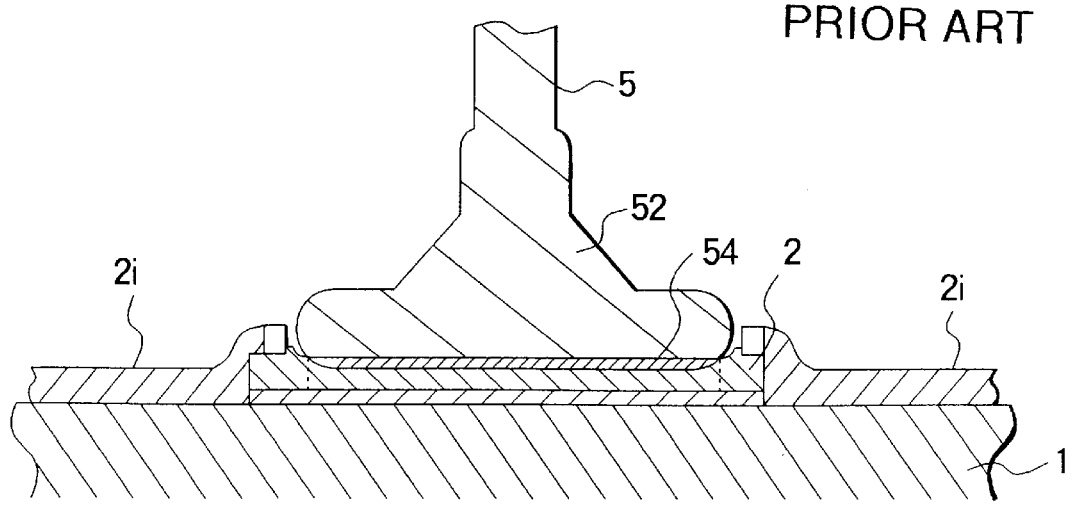
FIG. 45 is a cross-sectional view for describing joining of a gold ball to an electrode.
Figure 46:
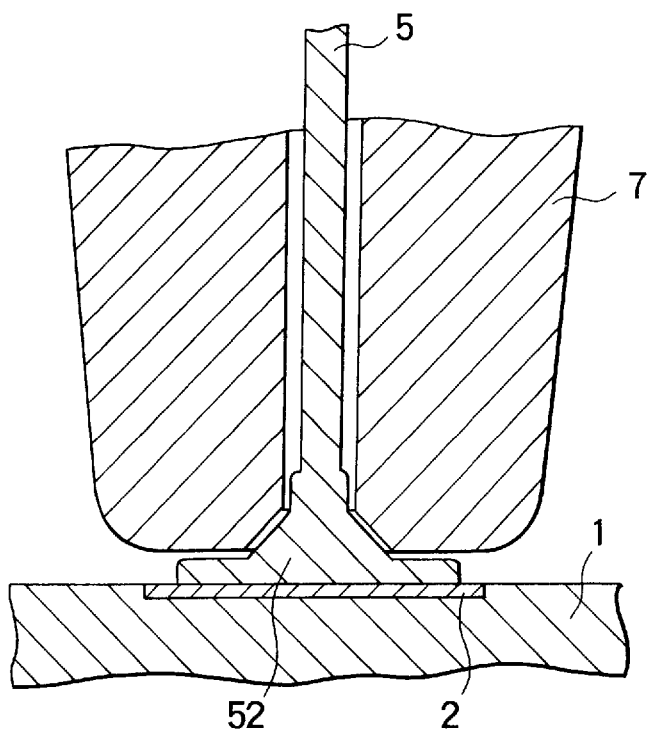
FIG. 46 is a cross-sectional view for describing wire bonding of a gold wire.
Figure 47:
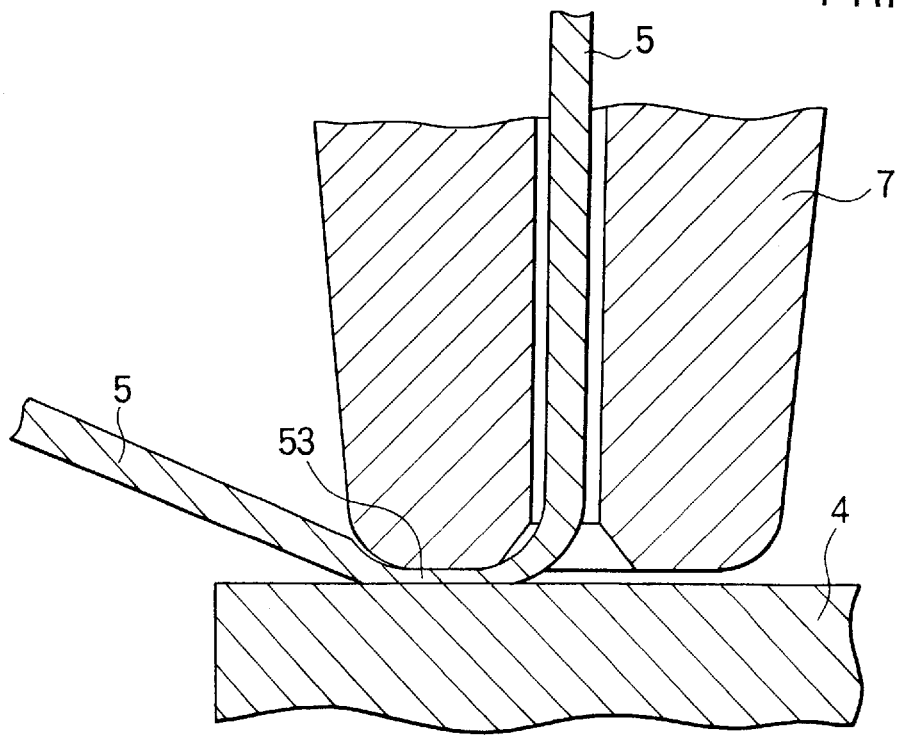
FIG. 47 is a cross-sectional view for describing stitch bonding of a gold wire.
Figure 48A:
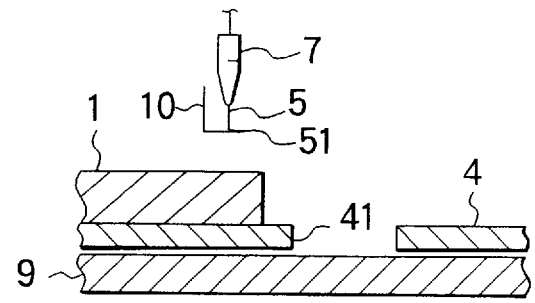
FIGS. 48A to 48E are cross-sectional views of a semiconductor device for describing wire bonding processes.
Figure 48B:
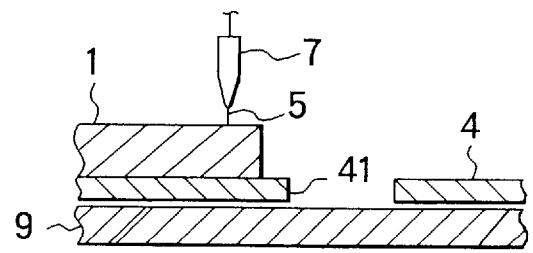
Figure 48C:
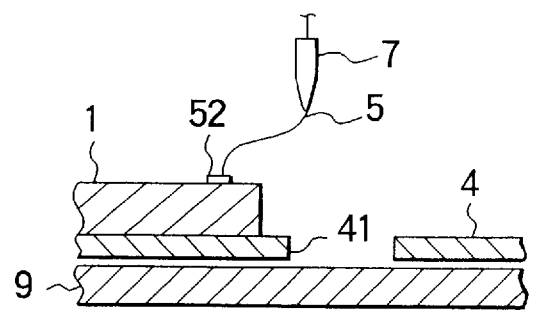
Figure 48D:
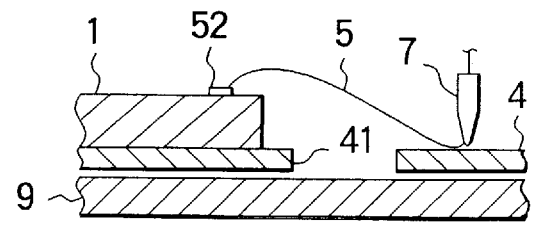
Figure 48E:
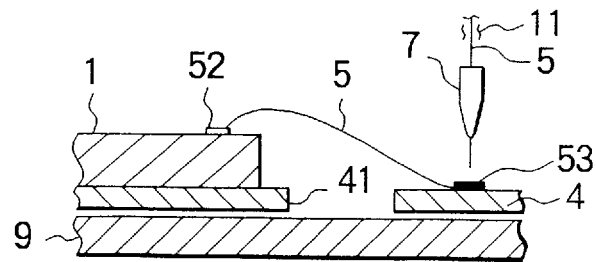

FIG. 17 illustrates one example in which the anodic bonding method according to this embodiment is applied to a semiconductor device. Compared with the semiconductor device manufactured by the conventional bonding method, as shown in FIG. 43, it can be understood from FIG. 17 that the gold wire 5, die pad 41, and die bonding material 6 are unnecessary. Further, it is possible that the semiconductor device be packaged with a molded resin 8 to the position indicated by the broken line.

Figure 18:
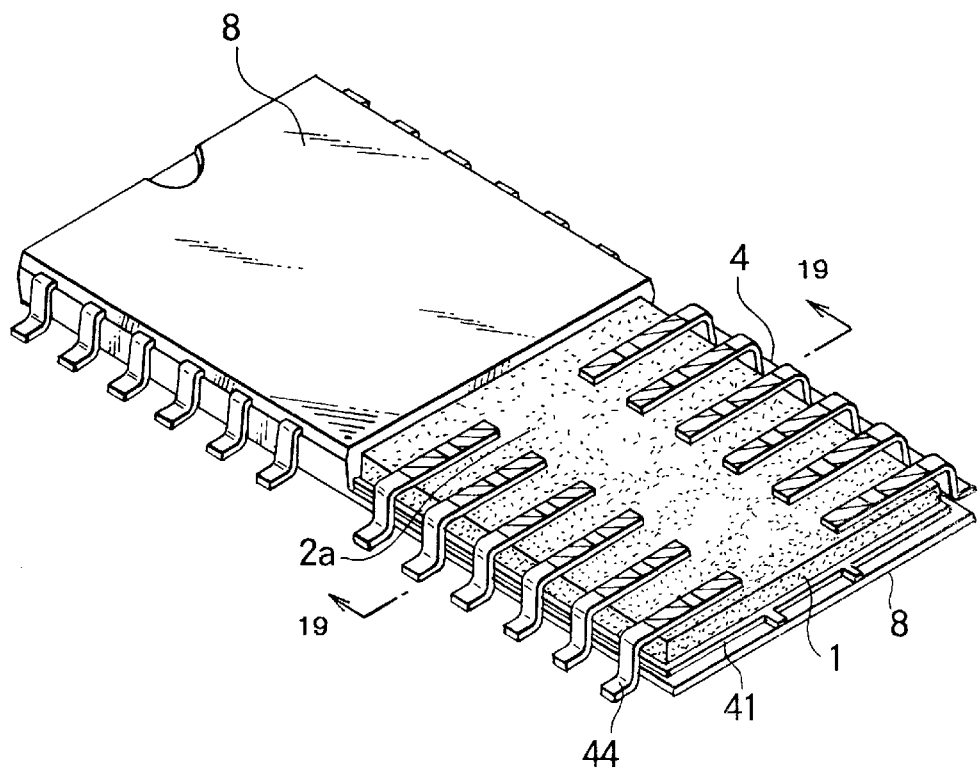
FIG. 18 is a perspective view of a semiconductor device showing an internal structure of a semiconductor device manufactured by anodic bonding.
Figure 19:
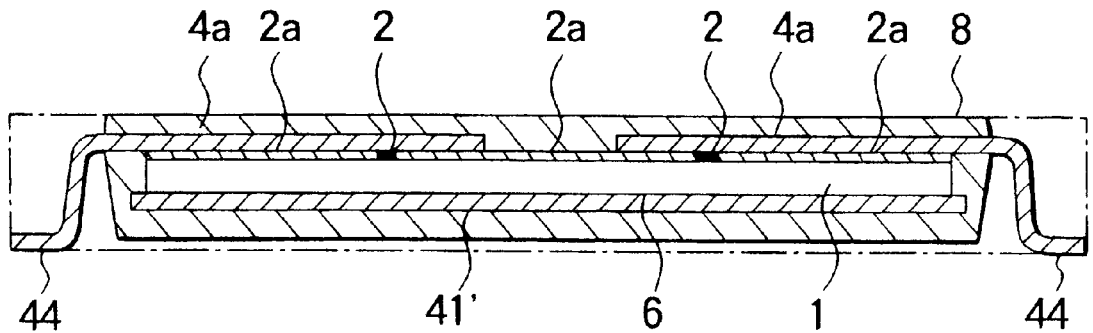
FIG. 19 is a cross-sectional view of a semiconductor device taken along line 19—19 in FIG. 18.
Figure 54A:
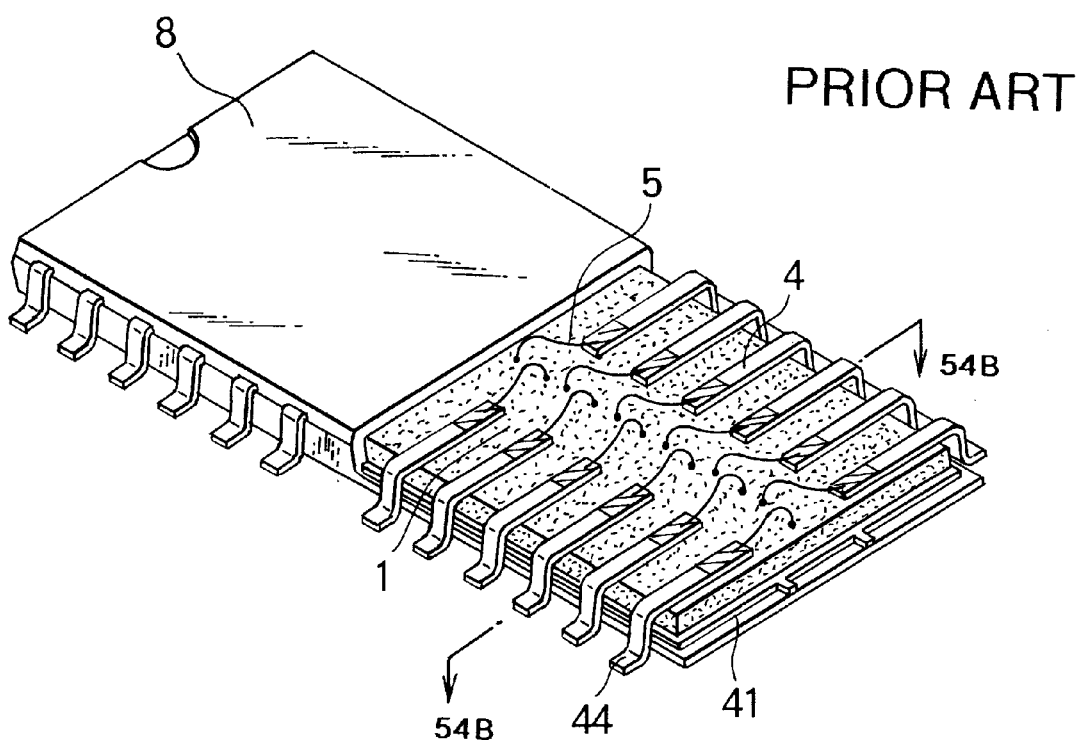
FIGS. 54A and 54B are a perspective view and cross-sectional view showing a semiconductor device manufactured using wire bonding.
Figure 54B:
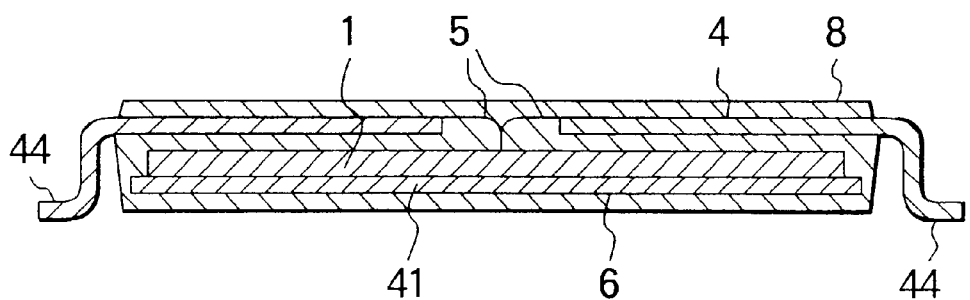

FIG. 18 shows an LOC (lead on chip) package based on the anodic bonding method according to this invention. FIG. 19 is a cross-sectional view taken along line 19—19 in FIG. 18 for easy understanding of the anodically bonded portion. As is obvious by referring to FIGS. 54A and 54B showing a conventional LOC package, in contrast to the case where the electrode 2 and the inner lead 4 are connected to each other through the gold wire 5, the inner lead 4a is directly connected to the electrode 2, thus providing an LOC semiconductor device with high reliability. It is also possible that the semiconductor device be packaged with a molded resin 8 up to the position indicated by the broken line in FIG. 19.

Figure 20:
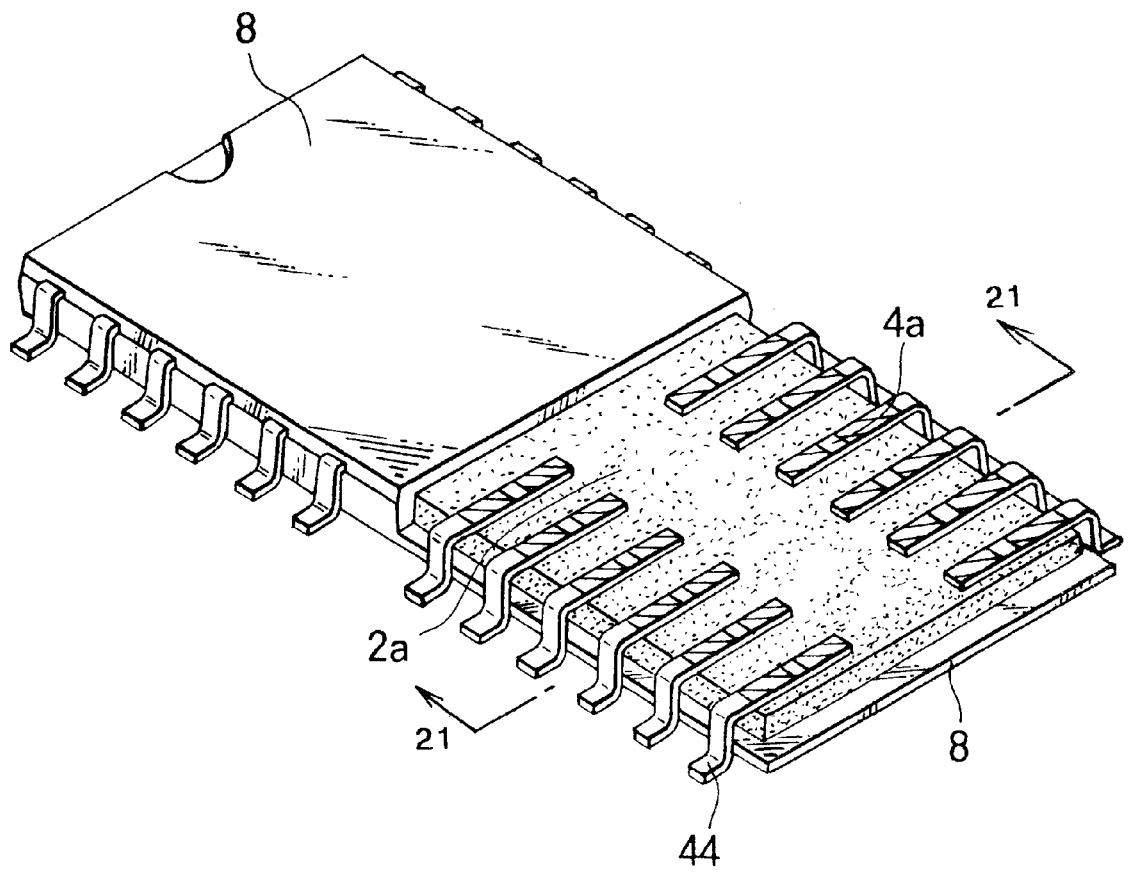
FIG. 20 is a perspective view of a semiconductor device showing an internal structure of the semiconductor device not requiring a die pad due to anodic bonding.
Figure 21:
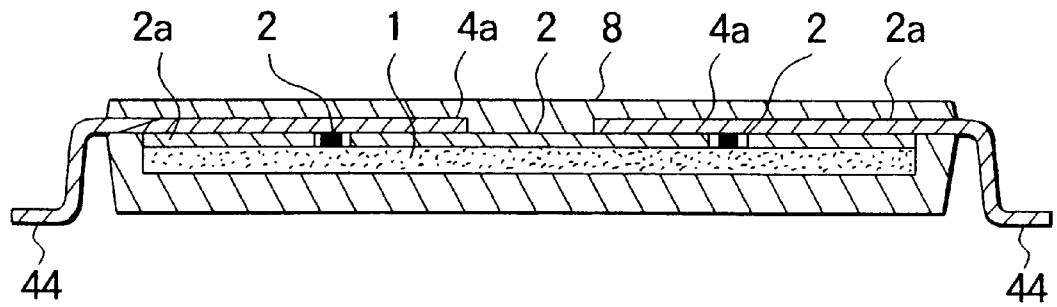
FIG. 21 is a cross-sectional view of a semiconductor device taken along line 21—21 in FIG. 20.

FIG. 20 shows one example in which, when the anodic bonding method is used, an LOC package is obtainable with no die pad 41. FIG. 21 is a cross-sectional view taken along line 21—21 in FIG. 20 for better understanding of the anodically bonded portion. As is obvious from these illustrations, the inner lead directly joined with the semiconductor chip 1 is fixed with a molded resin 8, whereby a die pad 41 supporting the semiconductor chip 1 can be omitted.

Figure 22:
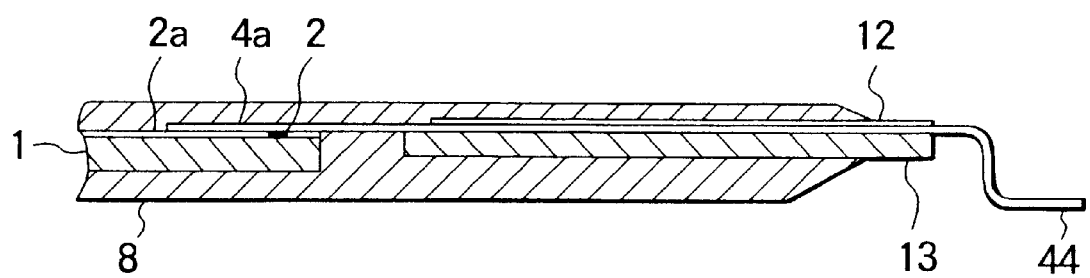
FIG. 22 is a cross-sectional view showing a semiconductor device manufactured using the anodic bonding method in accordance with the TAB technique.
Figure 23:
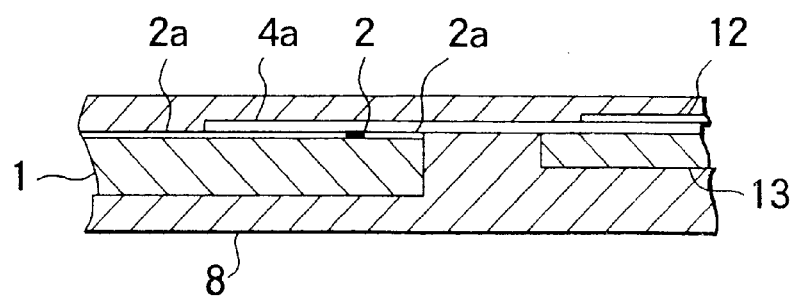
FIG. 23 is an enlarged cross-sectional view of a semiconductor device showing an anodically bonded portion in FIG. 22.
Figure 24:
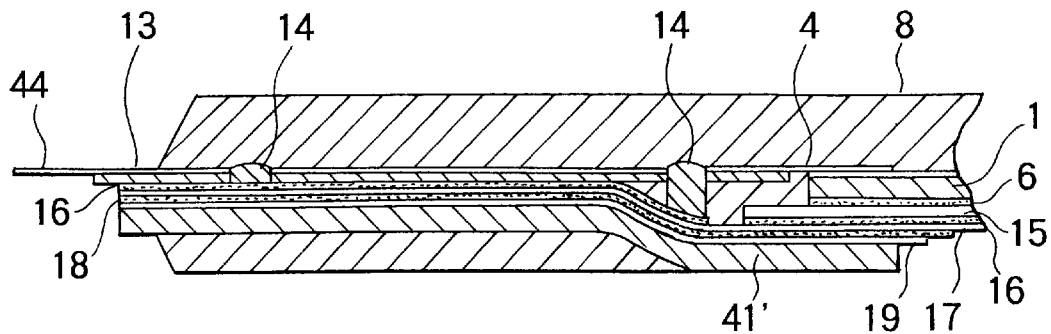
FIG. 24 is a cross-sectional view showing a large-output semiconductor device manufactured using anodic bonding.
Figure 25:
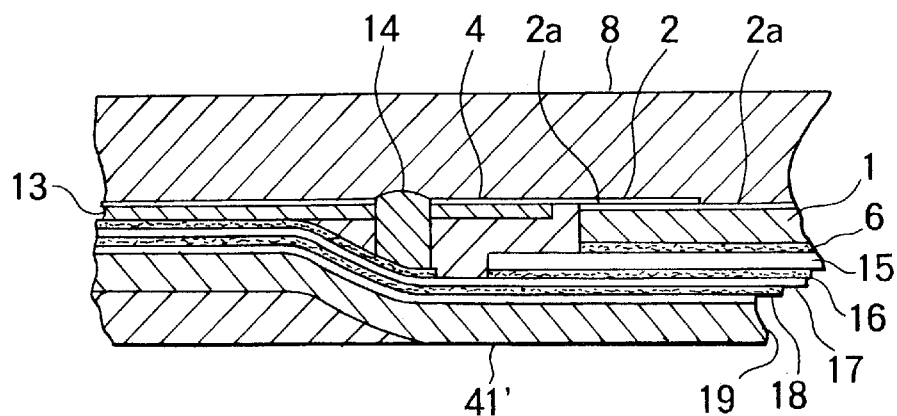
FIG. 25 is an enlarged cross-sectional view of a semiconductor device, showing an anode-junctioned portion in FIG. 24.
Figure 55A:
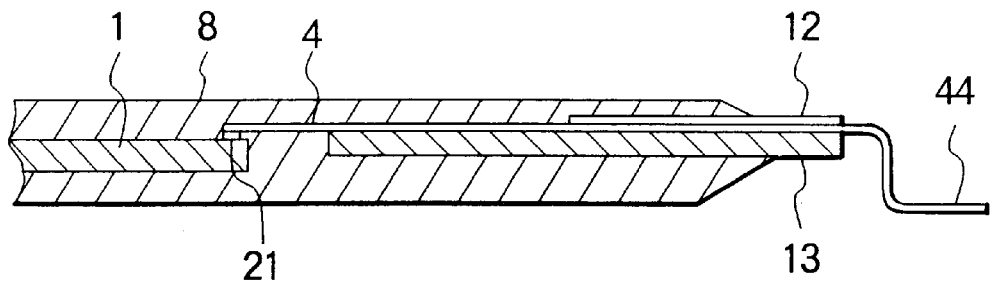
FIGS. 55A and 55B are a cross-sectional view of a semiconductor device manufactured according to the TAB technique and an enlarged cross-sectional view of a wire bonded portion.
Figure 55B:
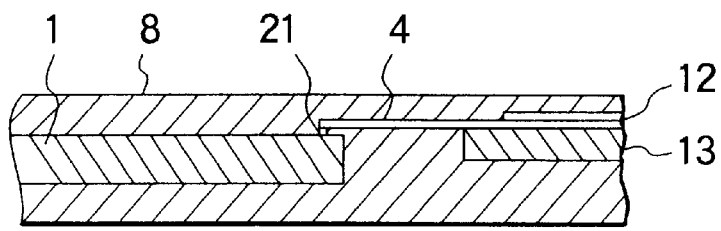

FIG. 22 shows one example of a TAB package manufactured using anodic bonding. Compared with the conventional TAB package as shown in FIGS. 55A and 55B, it is possible to make a stronger junction between the lead and the chip. FIG. 23 is an enlarged view showing the bonded portion in detail. FIG. 24 illustrates one example of a large-output IC manufactured using anodic bonding. FIG. 25 is an enlarged view of a bonded portion. In FIG. 25, numeral 41' designates a heat sink plate.

Sixth Embodiment

Figure 26:
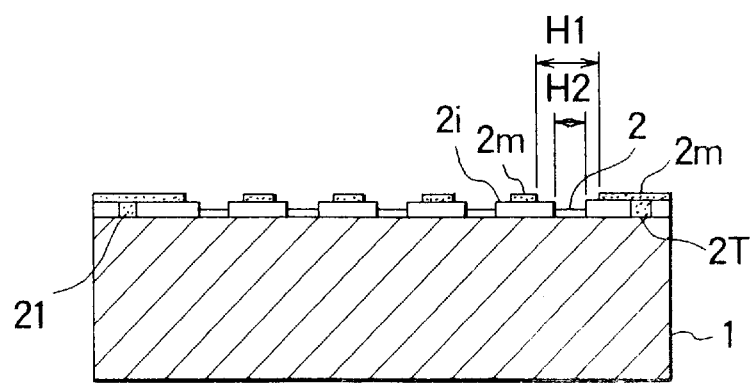
FIG. 26 is a cross-sectional view showing a semiconductor chip according to another embodiment.

Although in the described embodiments, the anodic bond is made when the lead frame 4 is used as the anode and the semiconductor chip 1 is used as the cathode, the lead frame 4 can be used as the cathode and the semiconductor chip can be used as the anode. When the semiconductor chip is used as the anode, as shown in FIG. 26, through-holes 2T reaching a silicon substrate are formed in a passivating insulating film on the semiconductor chip 1, the through-holes 2T being located at portions other than electrodes 2 on the semiconductor chip 1. After the through-holes 2T are formed, a metallic coating 2m is adhered to a passivating insulating film 2i. As a result, the metallic coating 2m is accumulated in the through-holes 2T, thereby establishing contact between the silicon substrate and the metallic coating 2m. After the metallic coating 2m is thus adhered, square openings with dimensions on one side of H1 are provided relative to the metallic film 2m, around the positions at which the electrodes 2 exist, with the result that the passivating insulating film 2i is exposed.

Secondly, square opening sections, each having a side H2, are provided around the positions of the electrode 2 relative to the exposed passivating insulating film 2i, so that the electrodes 2 are exposed. The dimension H2 of the opening section is determined in correspondence with the side dimension of quadrate electrode projecting portions provided at the tips of the inner leads 4a. On the other hand, the dimension H1 is determined in correspondence with the crushed width when the electrode projecting portion is pressed by the electrode 2 and plastically deformed.

A description will next be made with reference to FIG. 27 of a method of forming a lead frame 4 in which the anodic bonding is performed with the lead frame 4 used as the cathode. In the same illustration, square electrode projecting portions 2P, each having a side length of P, are provided at the tips of the inner leads 4a, i.e., the anodic bonding areas, and at the positions of the electrodes 2 on the semiconductor chip 1. In addition, an insulating coating 2a is adhered to the anode junctioning area other than the electrode projecting portion 2P.

Figure 27:
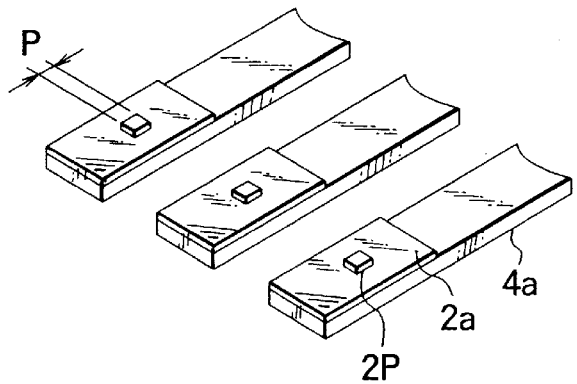
FIG. 27 is a perspective view showing a tip of inner leads anodically bonded to a semiconductor chip in FIG. 26.
Figure 28:
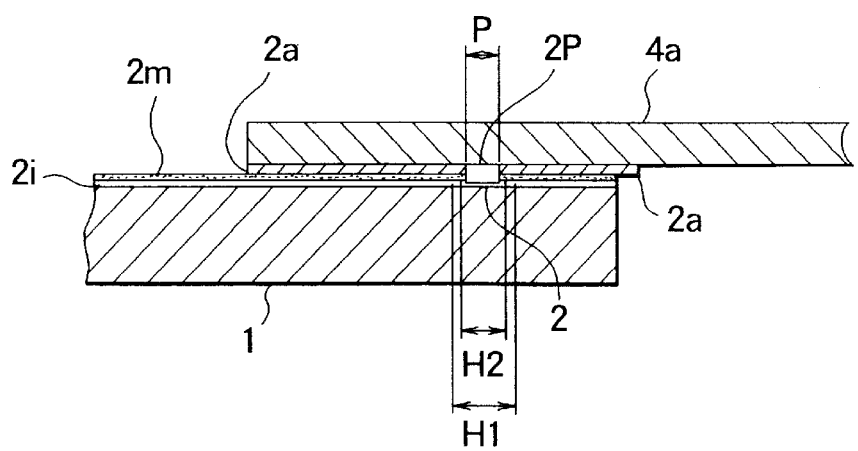
FIG. 28 is a cross-sectional view of a semiconductor chip showing the inner lead in FIG. 27 anodically bonded to the semiconductor chip in FIG. 26.

FIG. 28 is a cross-sectional view showing the completed anodic bond with the semiconductor chip as shown in FIG. 26 being used as the anode and the inner lead 4a shown in FIG. 27 being used as the cathode. In the illustration, the total thickness of the insulating coating 2a on the inner lead 4a, the thickness of the passivating insulating film 2i on the surface of the semiconductor chip 1, and the thickness of the metallic film 2m is smaller by Δh than the total thickness of the electrode projecting portion 2P on the lead frame 4 and the thickness of the electrode 2 on the semiconductor chip 1. When the inner lead 4a is anodically bonded to the semiconductor chip 1, the electrode projecting portion 2P is compressed by Δh, relative to the electrode 2, and joined therewith.

Seventh Embodiment

Although in the sixth embodiment the electrode projecting portion 2P in the anodically bonded area of the inner lead 4a is brought into pressure contact with the electrode 2 in the bottom surface of the opening section on the semiconductor chip 1, it is also appropriate that the electrode 2 protrude and the protruding electrode 2 be brought into pressure contact with the anodic bonding area of the inner lead 4a.

Figure 29:
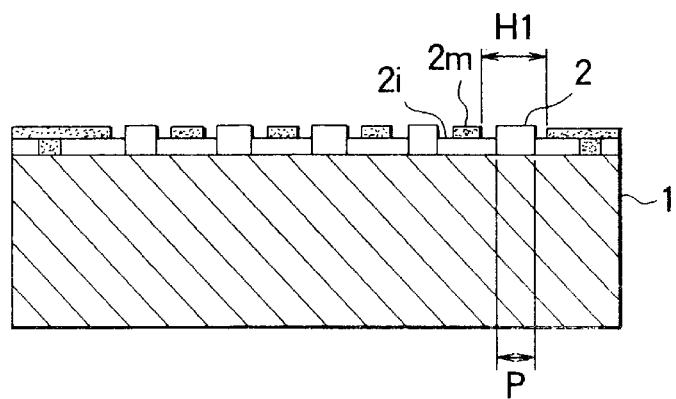
FIG. 29 is a cross-sectional view showing a semiconductor chip according to a further embodiment.

FIG. 29 is a cross-sectional view of a semiconductor chip 1 showing an arrangement in which the top surface of each square electrode 2 with each side dimension of P protrudes relative to the uppermost surface of a metallic coating 2m on a passivating insulating film 2i of the semiconductor chip 1, and an opening section with a side dimension of H1 is formed around the electrode 2 in the passivating insulating film 2i.

Figure 30:
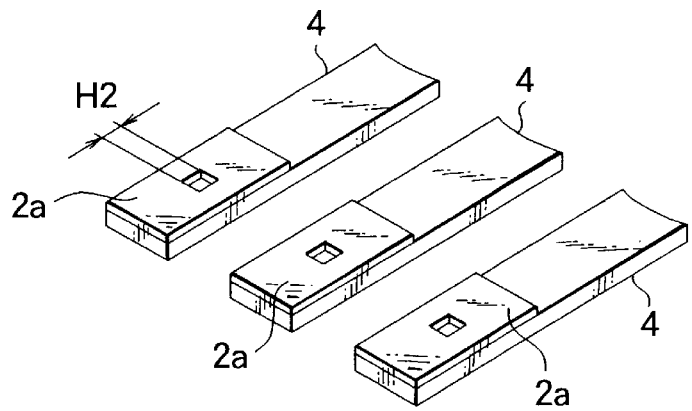
FIG. 30 is a perspective view showing a tip of an inner lead anodically bonded to the semiconductor chip in FIG. 29.

FIG. 30 is a perspective view showing a structure of an inner lead 4a, an insulating coating 2a which is electrically conductive when heated that is adhered on the anodic bonding area of the inner lead 4a, and an opening having a dimension of H2 at the position to be joined with the electrode 2 on the insulating coating 2a. A surface of a lead frame 4 appears at the bottom of the opening section.

Figure 31:
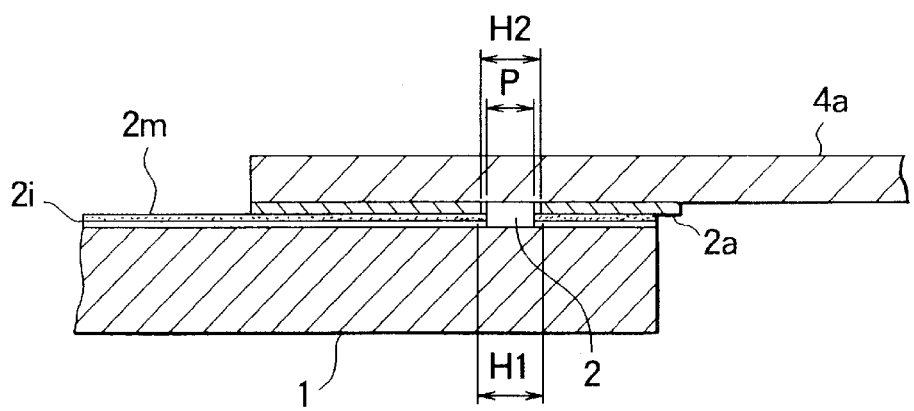
FIG. 31 is a cross-sectional view showing the inner lead in FIG. 30 anodically bonded to the semiconductor chip in FIG. 29.

FIG. 31 is a cross-sectional view showing a completed anodic bond with the semiconductor chip 1 shown in FIG. 29 being used as the anode and the inner lead 4a shown in FIG. 30 being used as the cathode. In the illustration, the total dimension of the thickness of an insulating coating 2a, the thickness of a passivation insulating film 2i, and the thickness of a metallic film 2m is smaller by Δh than the thickness of an electrode 2. As a result, when the inner lead 4a is anodically bonded to the semiconductor chip 1, an electrode projecting portion 2P and electrode 2 are compressed and deformed by Δh to make the electrical connection.

Eighth Embodiment

Although in the seventh embodiment the inner lead 4a and the semiconductor chip 1 are anodically bonded to each other so that the inner lead 4a is brought into contact with the electrode on the semiconductor chip 1 under pressure to make the electrical junction, it is also possible to mount a plurality of semiconductor chips 1 simultaneously on the insulating substrate with the semiconductor chips 1.

Figure 32:
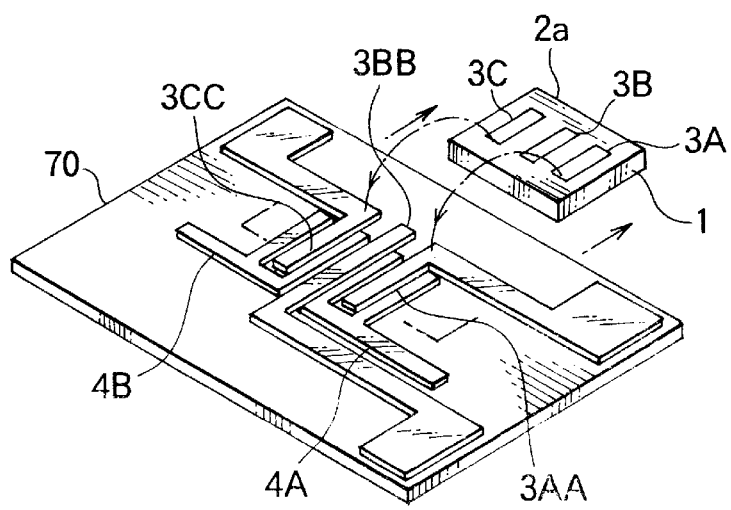
FIG. 32 is a perspective view showing a semiconductor chip mounted on a wiring substrate by anodic bonding.

FIG. 32 is a perspective view for describing a method of anodically bonding a semiconductor chip onto a wiring insulating substrate. In the illustration, surfaces of electrodes 3A to 3C separately disposed on the semiconductor chip 1 protrude by Δh from the surface of the insulating coating 2a. On a wiring insulating substrate 70 there are conductive wiring patterns 3AA to 3CC brought into pressure contact with the electrodes 3A to 3C on the semiconductor chip 1. Anodically bonded conductive elements 4A and 4B are made of the same material (copper foil) as a conductive wiring for anodically bonding to the insulating coating 2a.

Figure 33:
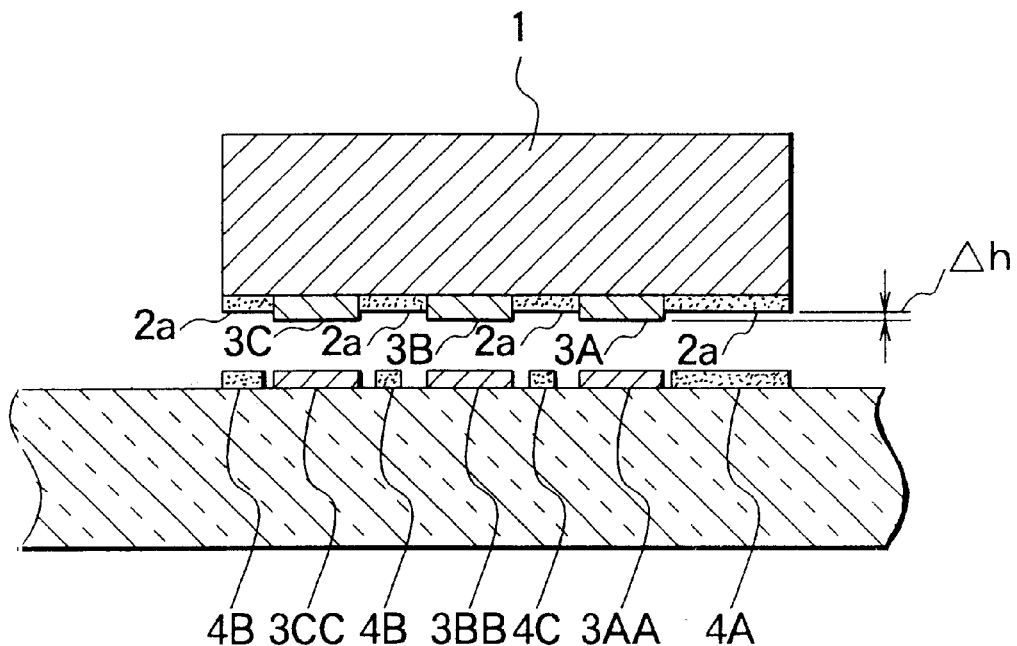
FIG. 33 is a cross-sectional view of a wiring substrate and semiconductor chip for describing an alignment between a wiring substrate and a semiconductor chip.
Figure 34:
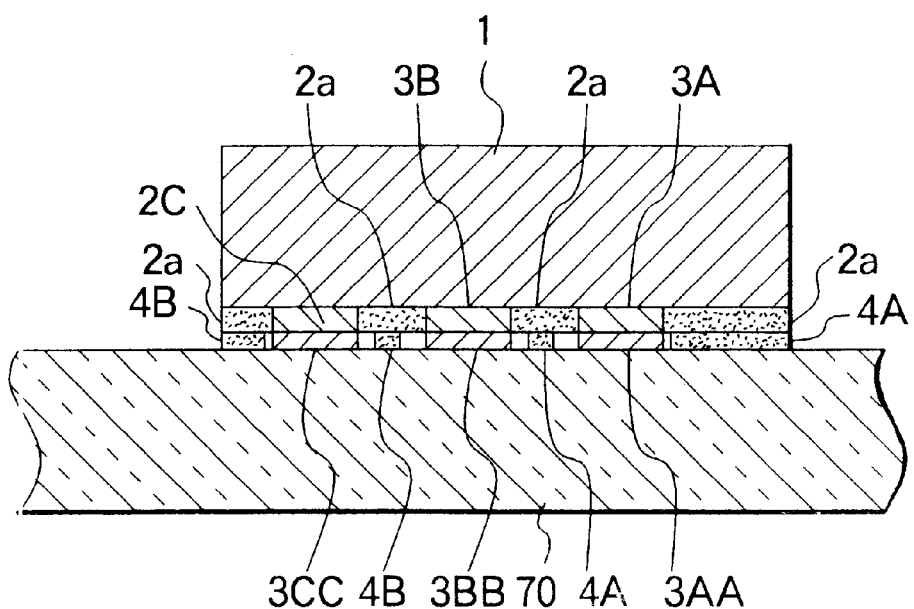
FIG. 34 is a cross-sectional view of a wiring substrate and semiconductor chip showing a semiconductor chip mounted on a wiring substrate in FIG. 32.

The electrodes 3A, 3B, and 3C of the semiconductor chip 1 thus arranged are adjusted to the positions of conductive wiring patterns 3AA, 3BB, and 3CC of the wiring insulating substrate 70. As shown in FIG. 33, the electrodes 3A to 3C are positioned in opposed relation to the conductive wiring 3AA to 3CC, and the anodic bonding elements 4A are 4B face the insulating coating 2a provided on the semiconductor chip 1 surface. After the positioning is completed, the semiconductor chip 1 is stacked on the wiring insulating substrate 70, and the cathode of a direct-current voltage source, not shown, is connected to the semiconductor chip 1 and the anode of the direct-current voltage source is coupled to the elements 4A and 4B. In this state, when the element 4A is heated, as illustrated in FIG. 3, an anodic bond is made between the elements 4A and 4B and the insulating coating 2a on the semiconductor chip 1. As a result, the conductive wiring patterns 3AA to 3CC are subjected to compression due to the electrode portions 3A to 3C with a magnitude corresponding to Δh, thus making the electrical connections therebetween. In addition, the semiconductor chip 1 and the wiring insulating substrate 70 are firmly joined with each other through the insulating coating 2a and the elements 4A and 4B.

Ninth Embodiment

Although in FIGS. 32 and 33 the elements 4A and 4B are located in the wiring insulating substrate 70 side and anodically bonded to the insulating coating 2a on the semiconductor chip surface and used as the anode, the wiring insulating substrate 70 side can be used as the cathode and the semiconductor chip side used as the anode, as illustrated in FIG. 29. Each of the elements (metallic coating) is adhered to an electrical insulating film surrounding an electrode 2 to maintain sufficient insulation from the electrode 2. Further, the insulating coating 2a is adhered to the wiring insulating substrate 70 except at the wiring conductors 3AA to 3CC.

Thereafter, the electrodes 2 of the semiconductor chip 1 are positioned on the wiring conductors 3AA to 3CC of the wiring insulating substrate 70 before the anode of a direct-current voltage source, not shown, is connected to the semiconductor chip 1 and the cathode is connected to the elements 4A and 4B so that the anodic bond is made between the insulating coating 2a and the elements 4A and 4B to make electrical junctions between the electrodes 2 and the wiring conductors 3AA to 3CC.

Tenth Embodiment

Figure 35A:
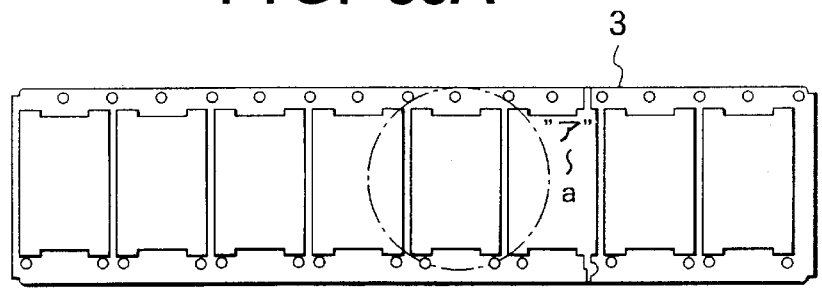
FIGS. 35A, 35B, and 35C are plan views showing a plane configuration of a lead frame to be used in manufacturing a semiconductor device by anodic bonding.
Figure 35B:
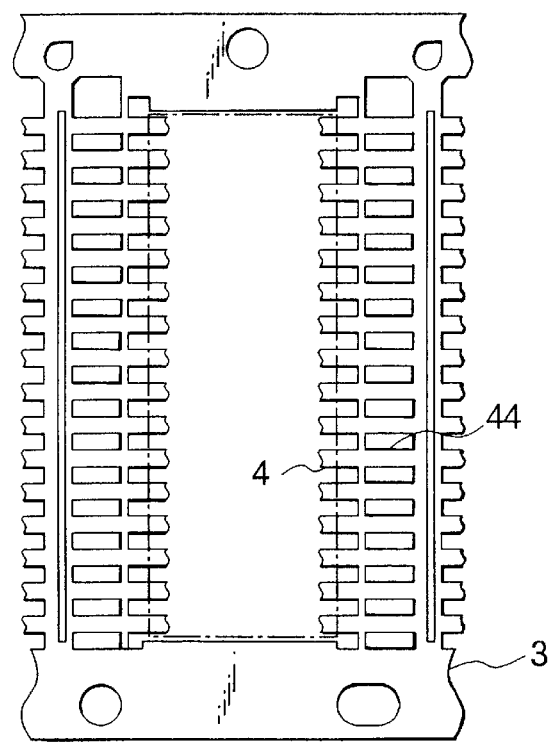
Figure 35C:
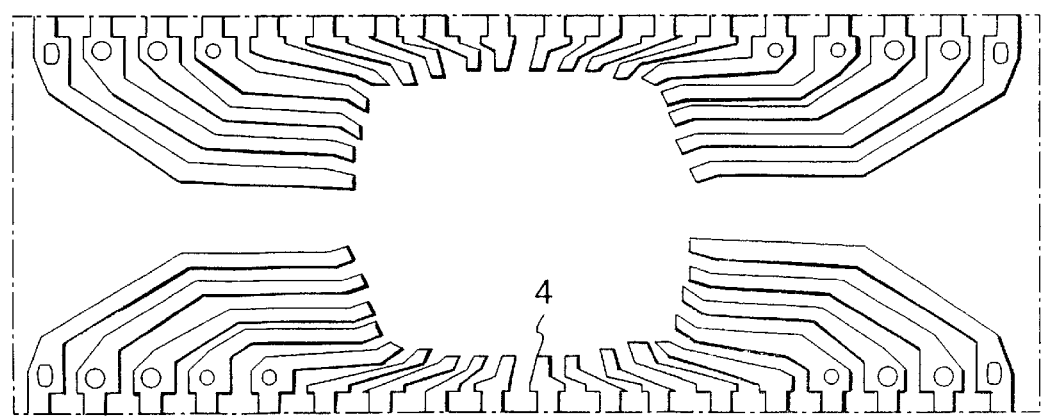

FIGS. 35A to 35C are plan views showing in detail a structure of a lead frame used in manufacturing a semiconductor device using the anodic bonding method according to this embodiment. FIG. 35A shows one example in which eight lead groups are successively arranged. In the illustration, numeral 3 designates a lead frame border. FIG. 35B is an enlarged illustration of a portion indicated by "a" in FIG. 35A. In the illustration, numeral 3 represents a lead frame border, numeral 4a denotes inner leads whose tips are omitted, and numeral 44 depicts outer leads. FIG. 35C shows the tips of the inner leads 4a which are omitted in FIG. 35B.

In FIG. 35C, although the tips of the inner leads designated at 4a are not shown to approach the central portion, this is to facilitate comparison with the conventional inner leads shown in FIG. 42. Thus, it is possible for the tips of the inner leads 4a to approach the central portion. As shown in FIG. 35A, the die pad 41 and the suspended leads 42 for supporting the die pad 41 are unnecessary, with the result that the separation between the inner leads can be made larger. In addition, because there is no die pad 41, the central portion can freely be used for the inner leads. In addition, although the tips of the conventional inner leads 4a require expensive silver plating because of the ultrasonic thermocompression bonding with gold wires, the anodic bonding method eliminates the requirement of precious-metal plating. Further, as long as the inner lead 4a surface has a high degree of planarity, even if a metallic oxide film exists on the inner lead 4a, an anodic bond can be accomplished without any problem and the inner lead 4a can be firmly bonded with the semiconductor chip 1.

Although in FIG. 35A spaces are present in place of the suspended leads, when a lead frame is used according to this embodiment, the tips of the inner leads 4a can be disposed at the positions corresponding to the electrodes 2 at the four sides of the semiconductor chip. Further, although the conventional lead frame does not allow the tips of the inner leads to be arranged at the suspended leads, this embodiment removes this limitation.

Eleventh Embodiment

The lead frame shown in FIGS. 35A to 35C is usable as a jig for simultaneously placing a plurality of semiconductor chips, to be anodically bonded, at the normal positions of the inner leads 4a. In this case, two lead frames 3 are stacked on top of each other so that the pitch holes made in the lead frame borders are aligned with each other. The inner leads 4a of the upper side lead frames 3 are bent upwardly at right angles along the circumferential configuration of the semiconductor chip 1. In addition, the tips of the inner leads 4a of the lower side lead frame 3 are made to extend to the positions corresponding to the electrodes 2 on the semiconductor chip 1, as indicated in FIG. 3.

In this state, the wiring surface of the semiconductor chip 1 faces downward and is put on the inner leads 4a of the lead frame 3 along the bent inner leads 4a. As a result, the electrodes 2 and the inner leads 4a to be anodically bonded are accurately positioned without misalignment. Using this jig allows simultaneous anodic bonding of a number of chips, thus improving the efficiency of semiconductor device manufacturing work.

Twelfth Embodiment

Figure 36A:
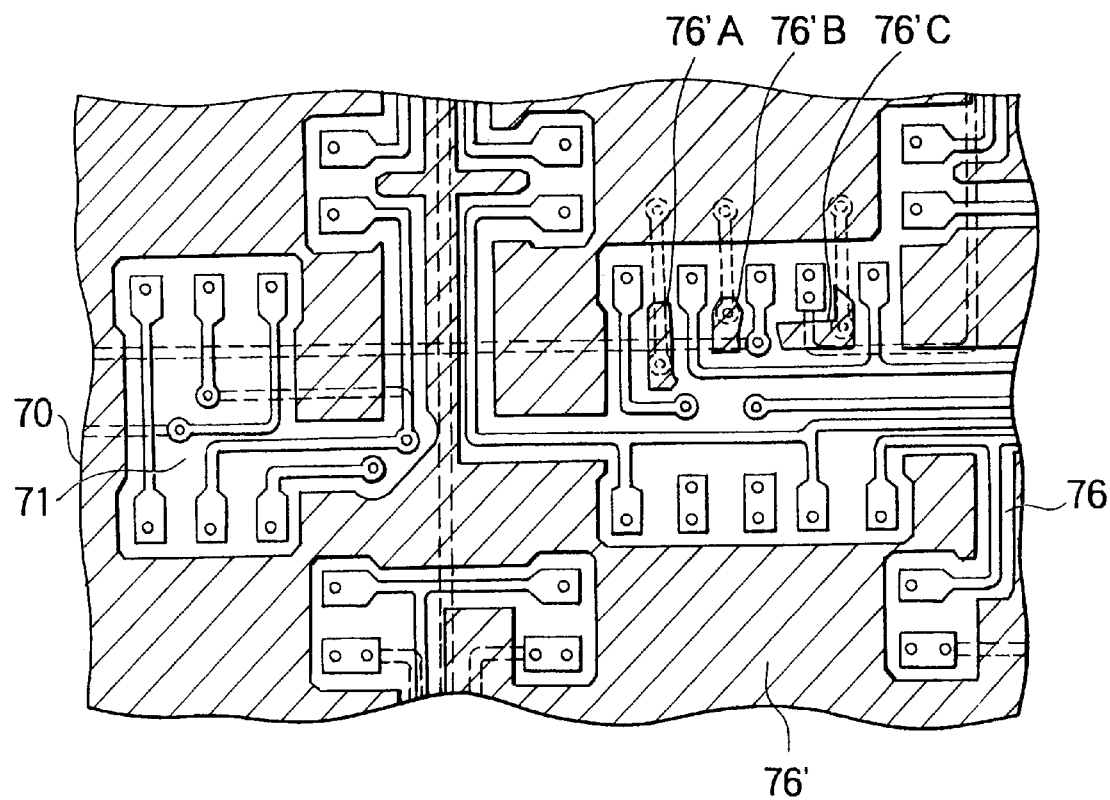
FIGS. 36A and 36B are a plan view of a wiring substrate to be used in manufacturing a laminated multi-layer wiring substrate according to an anodic bonding method and a cross-sectional view of a completed laminated multi-layer wiring substrate, respectively.
Figure 36B:
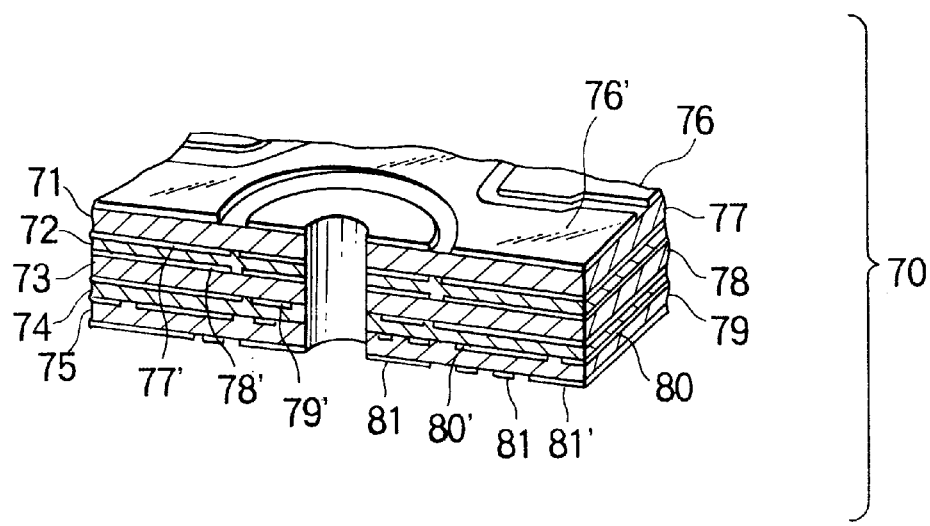

FIGS. 36A and 36B are illustrations of one example in which the anodic bonding method is applicable to the fabrication of a laminated multi-layer substrate. A multi-layer insulating substrate 70 is constructed with five insulating substrates 71, 72, 73, 74, and 75, and wiring patterns 76, 77, 78, 79, 80, and 81 are provided on the insulating substrates 71, 72, 73, 74, and 75, respectively. FIG. 36A shows the wiring 76 for the insulating substrate 71. Further, for the construction of a laminated multi-layer substrate by the anodic bonding method according to this embodiment, anodic bonding elements 76', 77', 78', 79', 80', and 81' are placed on the insulating substrates 71, 72, 73, 74, and 75, respectively. FIG. 36A illustrates the element 76' for the insulating substrate 71.

In a case where, for example, the element 76' is formed on the insulating substrate 71, a copper foil is affixed onto the entire surface of the insulating substrate 71 before the conductive wiring 76 is patterned by etching. In order to leave the pattern, the etching is carried out around the pattern to maintain a width corresponding to the minimum insulating distance. In this case, the copper foil plate in which the separation between the conductive wiring is narrow is etched, while, when the separation is wide, the copper foil remains therebetween; that is, as shown in FIG. 36A, the copper foil, being element 76', may remain over a wide range, or, depending on places, the copper foil can remain as small isolated islands as indicated by 76'A, 76'B, 76'C. An insulating coating is adhered to the remaining copper foil, thereby making the elements. At this time, the remaining copper foil portions 76'A, 76'B, 76'C are electrically coupled to each other via through-holes to have the same polarity.

FIG. 36B is an enlarged view of a through-hole section. The through-hole illustrated is for electrical coupling of the conductors 81, 78, and 77.

Next, a description will be given of the process by which the insulating substrates 71 to 75 are stacked on top of each other to make the multi-layer insulating substrate 70.

1) the conductive wiring 78 and the elements 78' are formed on the insulating substrate 73, and the conductive wiring 79 and the element 79' are made by etching;

2) the conductive wiring 77 and the element 77' are formed on the insulating substrate 72 by etching, and, further, the conductive wiring 80 and the element 80' are made on the insulating substrate 74 by etching;

3) the conductive wiring 76 and the element 76' are made on the insulating substrate 71 by etching; and 4) the conductive wiring 81 and the element 81' are made on the insulating substrate 75 by etching.

In piling up the insulating substrates 71 to 75, the insulating substrate 73 is used as the anode, the insulating substrate 72 is placed on the upper side of the insulating substrate 73, the insulating substrate 74 is placed on the lower side of the insulating substrate 73, and the insulating substrates 72 and 74 are used as the cathode. A direct-current voltage is applied while heating so that the element 78' of the insulating substrate 73 is joined with the insulating substrate 72 and, at the same time, the element 79' of the insulating substrate 72 and the insulating substrate 74 are anodically bonded.

After the insulating substrates 72, 73, and 74 are bonded to make a three-layer substrate, the three-layer substrate is used as the anode, the insulating substrate 71 is placed on the upper side of the three-layer substrate, and the insulating substrate 75 is placed on the lower side, and the insulating substrates 71 and 75 are used as the cathode so that, while heating, a direct-current voltage is applied to carry out the anodic bonding. The element 77' of the insulating substrate 72 and the insulating substrate 71 are anodically bonded, and the element 80' of the insulating substrate 74 and the insulating substrate 71 are anodically bonded, thus completing a six-layer substrate.

In the case of the laminated substrate thus formed, the element can be utilized as a grounding surface with the result that there is no need for a special grounding layer to be added, thus reducing the number of wiring layers. In addition, the element can also be used as an electromagnetic shield.

Thirteenth Embodiment

Figure 37A:
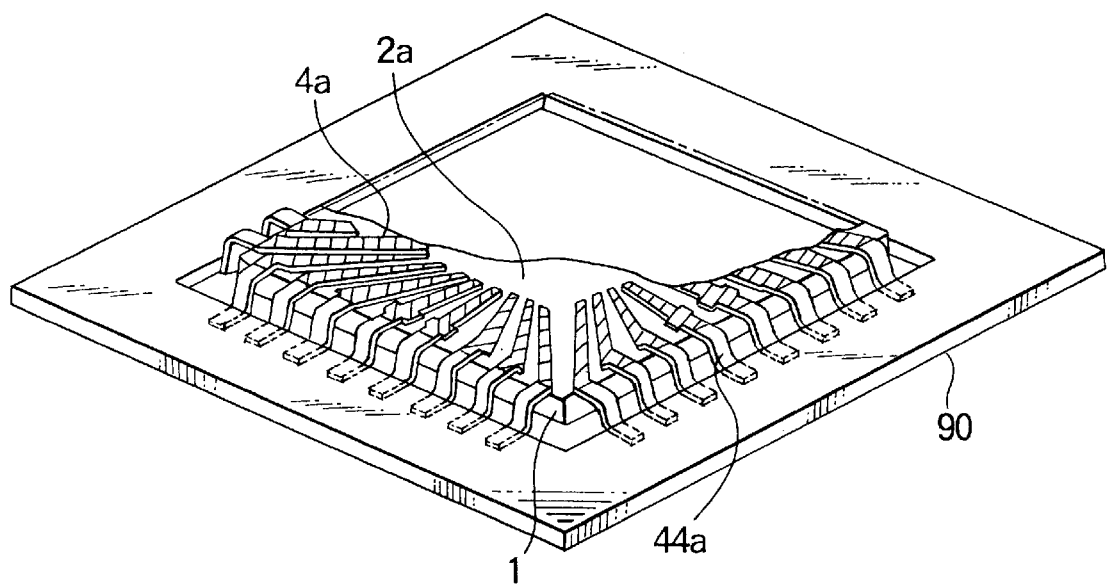
FIGS. 37A and 37B are perspective views of semiconductor chips for describing a state in which an external connection lead is joined with a wiring conductor by anodic bonding.

FIG. 37A is a perspective view of a semiconductor device, showing a state in which external leads 44 are anodically bonded to a wiring substrate and a mother board substrate. In the illustration, numeral 90 represents a metallic plate having a given weight. Inside the metallic plate 90 there is provided an opening conforming to the contour of a semiconductor device using a QFP package with a square shape. When the top surface of the semiconductor device is put into this opening, the sides of the opening are placed on tips 44a, being the bent tips of the external leads 44, so that a given load is applied. After the bent tips of the external leads are placed on the wiring conductors on the wiring substrate, the metallic plate 90 is placed on the tips 44a, whereby the metallic plate 90 becomes the common electrode for the external leads 44, and, because of the load applied, the degree of planarity of the tips 44a is adjustable.

Figure 37B:
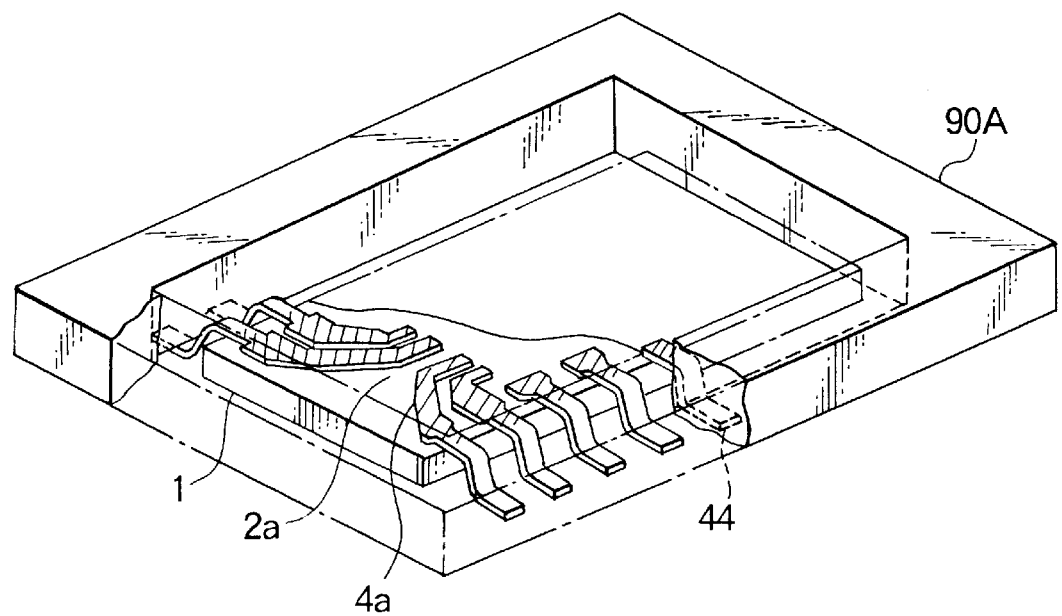

FIG. 37B is a perspective view of a semiconductor device showing a state in which, for mounting, external leads 44 of the semiconductor device with an SOP package having a rectangular shape are anodically bonded to a wiring substrate or mother board substrate. In the illustration, 90A represents a metallic plate having a given weight. Inside the metallic plate 90A there is provided an opening conforming to the contour of the semiconductor. When the top surface of the semiconductor device is put into the opening, the sides of the opening are placed on tips 44a of external leads 44 so that a given load is applied. The use of the metallic plate 90A is the same as that of the metallic plate 90. In addition, it is also appropriate that the metallic plate 90A be made to have a U-shape or the like. The bottom line is that the metallic pieces are placed so that a given load is applied to the tips 44a.

Next, a detailed description will be given of wiring conductors for the tips 44a. In this embodiment, in the contact surface of the tip 44a, an area A is defined which handles the mechanical strength for the wiring conductor and an area B is also defined which handles the electrical connection for the wiring conductor. Onto the area A there is adhered an insulating coating 4a which has a slightly conductive property when heated. On the other hand, nothing is adhered onto the area B, thus maintaining the electrical connection with the wiring conductor.

In such a state, the bonding tips 44a are placed on the corresponding wiring conductors, before the sides of the opening section of the metallic plate 90 are placed on the bonding tips 44a, so that a load is applied. The negative potential of a direct-current power supply voltage is applied to the tips 44a through the metallic plate 90. All of the wiring conductors are short-circuited at the time of the formation of the wiring pattern and subjected to the positive potential of the direct-current power supply voltage. After the anodic bonding, they are released from the short-circuited state.

After the respective potentials are prepared for the application, while the bonding tips 44a are heated, the direct-current power supply voltage causes a positive current to flow from the wiring conductors to the metallic plate 90 so that the anodic bond is made between the bonding surface of the bonding leads 44 and the wiring conductors. As a result, electrostatic adhesive strength and electrochemical bonding strength are generated between the area A and the wiring conductor to accomplish the anodic bonding, and the area B and the wiring conductor are electrically bonded to each other with an anodic bond. When being electrically joined, the bonding surface of the area B is plastically deformed, and the bonding tips 44a are pressure-joined with the wiring conductor by the force generated when deformed.

When the semiconductor chip 1 and the inner leads 4a are anodically bonded to each other, the area of the entire surface of the semiconductor chip 1 on which the electrodes 2 are disposed is defined as the area B, and the surface other than the electrode 2 area is defined as the area A.

Fourteenth Embodiment

In the foregoing embodiment, as described with reference to FIGS. 37A and 37B, a jig is provided so that the external lead 44 is used as the cathode and the wiring conductor is used as the anode for the anodic bond between the external lead 44 and the wiring conductor. However, it is also possible that, by using such a jig, an anodic bond is made between the external lead 44 of the semiconductor chip 1 and the wiring conductor with the external lead 44 being used as the anode and the wiring conductor being used as the cathode. In this case, an insulating coating 2a is adhered to substantially half of ten upper and lower external lead connecting portions so patterned, for example, on the laminated insulating substrate 70 shown in FIG. 36, which, in turn, are connected to an electrically insulating film 76' indicated by hatching. At this time, the insulating coating 4a is adhered to the electrically insulating film 76'.

Furthermore, as shown in FIG. 37A, the bonding tips 44a of the semiconductor chip 1 are placed on the external lead connecting portions, and the bonding tips 44a are pressed by the metallic plate 90. At this time, while a positive potential is applied to the metallic plate 90 and a negative potential is applied to the insulating coating 4a of the wiring insulating substrate 70, the wiring insulating substrate 70 is heated, whereby the bonding surface of the external lead 44 and the external lead connecting portion are anodically bonded to each other. When a projection is formed at a portion of the external lead connecting portion onto which the insulating coating is not adhered, the electrical connection is improved between the bonding surface of the external lead 44 and the external lead connection portion in the anodic bond.

Fifteenth Embodiment

Although in FIGS. 37A and 37B the external leads 44 extend and cross over the periphery of the semiconductor chip 1 and the bonding tips 44a which are the tips thereof anodically bonded to the wiring conductors, it is also appropriate that a portion of the inner lead 4a other than the portion to be anodically bonded (hatched portion) be cut off and the surface of the inner lead 4a remaining on the semiconductor chip 1 be anodically bonded to the corresponding wiring conductor. As a result, the mounting area of the circuit can be enlarged by extension of the external lead 44.

Sixteenth Embodiment

As another application example, there is a method in which, in the semiconductor device based on the current wire bonding method, a chip is anodically bonded to a die pad of a lead frame. In this method, an insulating coating is adhered to the rear surface of the semiconductor chip and the anodic bond is made with the semiconductor chip side being used as the cathode and the die pad being used as the anode. An insulating coating 2a is adhered to a surface of a frame die pad and the anodic bonding is carried out with the lead frame die pad being used as the cathode and the semiconductor chip side being used as the anode.

Seventeenth Embodiment

Figure 38A:
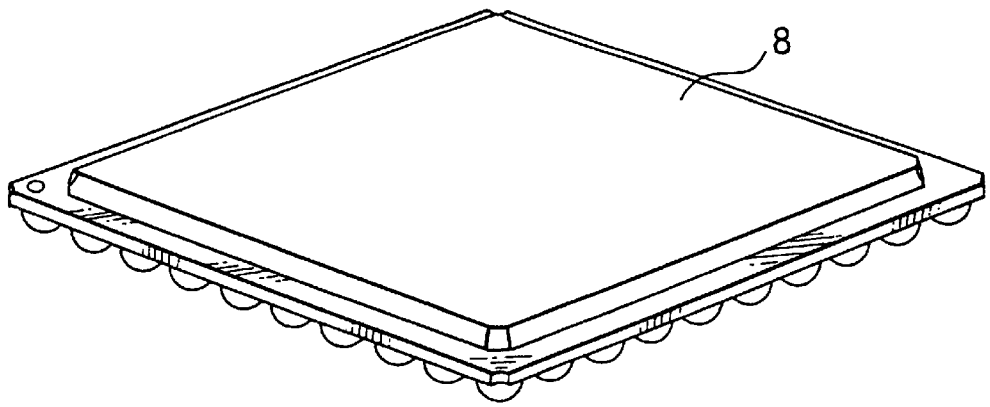
FIGS. 38A to 38C are perspective views and a cross-sectional view schematically showing a semiconductor device using a ball grid array in place of an external connection lead.
Figure 38B:
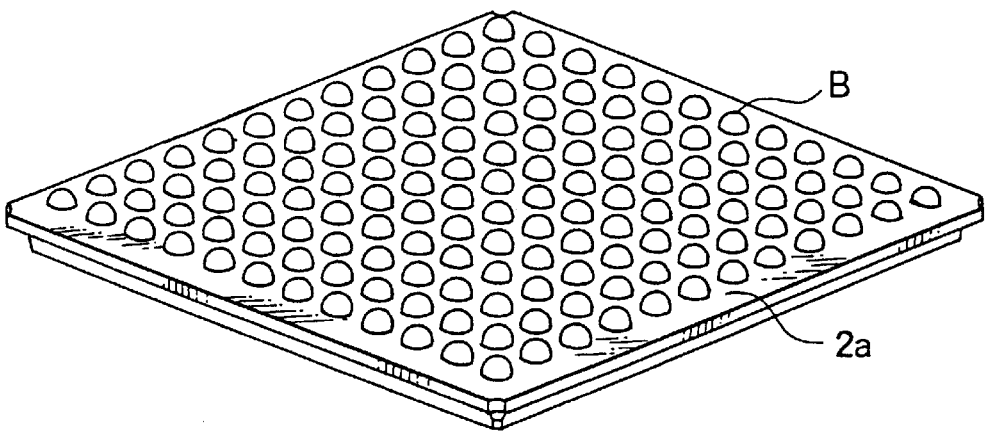

If the anodic bond is used in mounting a semiconductor device with a ball grid array on a wiring substrate, the mounting work can be made simple. FIG. 38A is a perspective view showing a semiconductor device using a ball grid array in place of an external connecting lead. FIG. 38B is a perspective view showing the bottom surface of the semiconductor device. Ball-like bumps B are disposed on the bottom surface in a matrix configuration. These bumps B are connected to electrodes on the semiconductor chip 1.

Figure 38C:
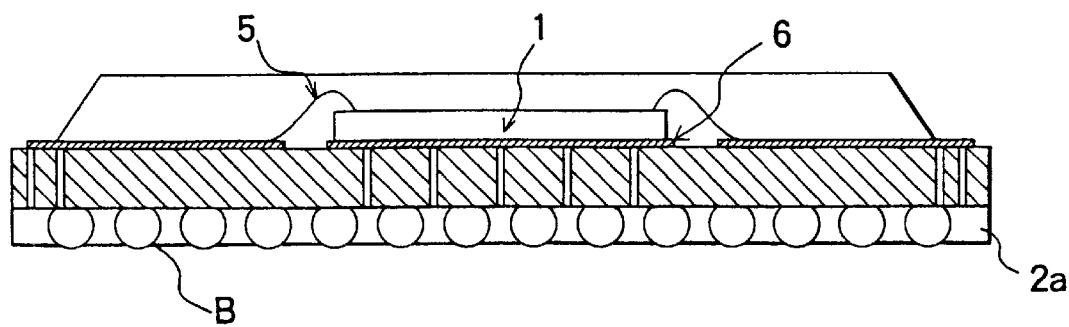
Figure 39:
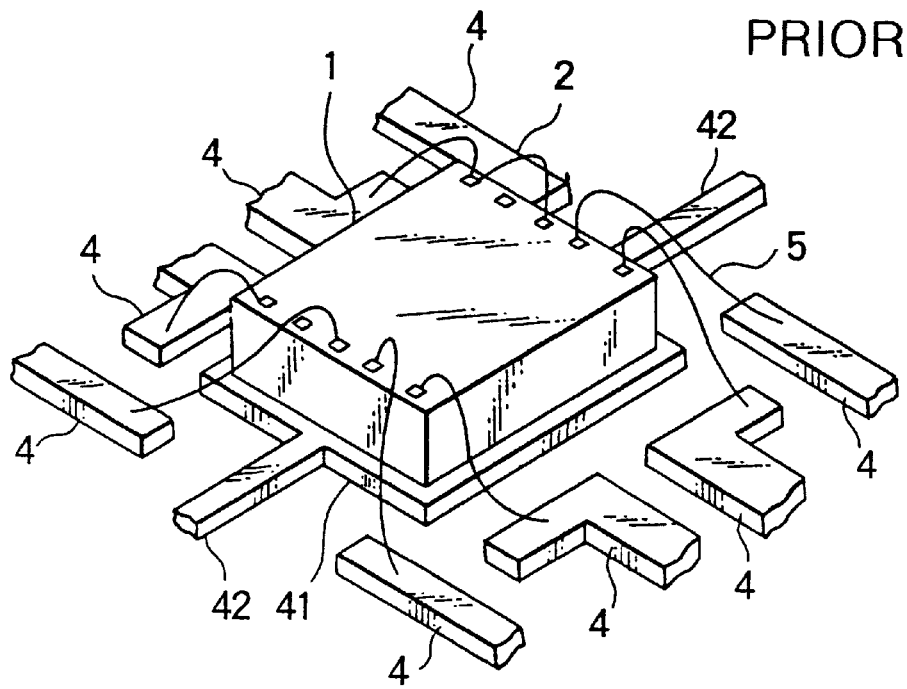
FIG. 39 is a perspective view of a semiconductor chip for describing a conventional wire bonding method.
Figure 40:
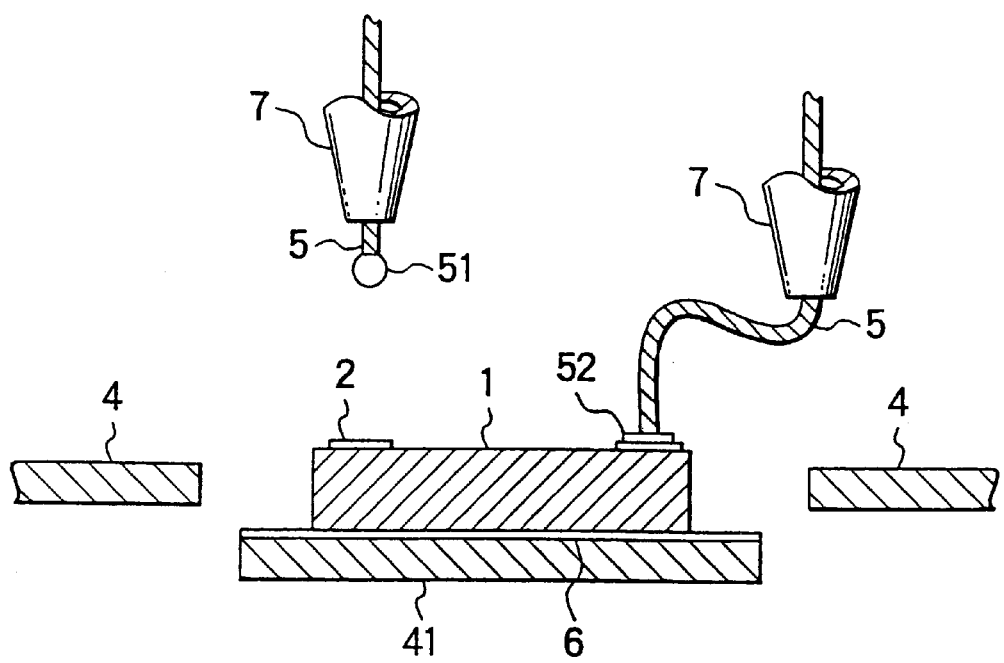
FIG. 40 is a cross-sectional view of a semiconductor chip for describing wire bonding using a gold wire.
Figure 41A:
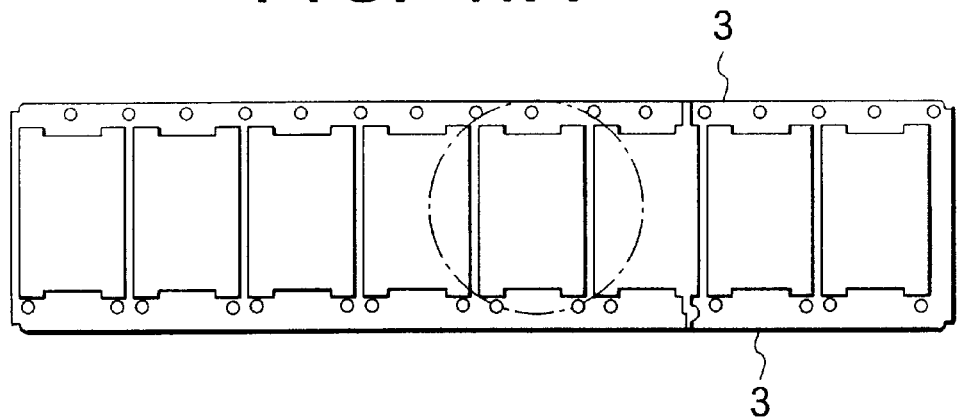
FIGS. 41A and 41B are a plan view showing a conventional lead frame and an enlarged plan view showing a portion thereof.
Figure 41B:
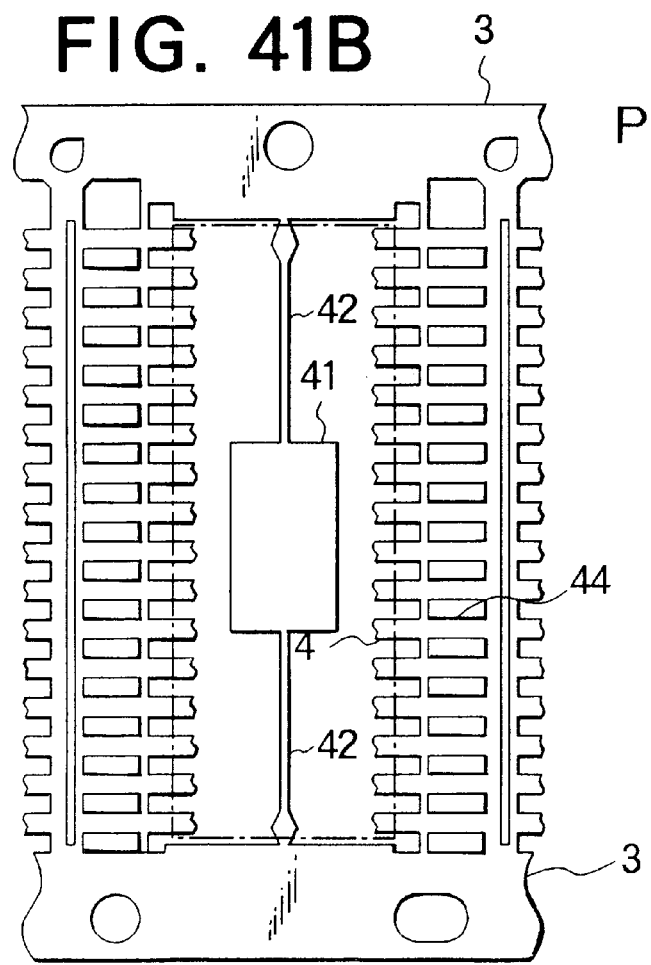

FIG. 38C is a cross-sectional view of the semiconductor device shown in FIG. 38A. The bumps B are coupled to the electrodes on the semiconductor chip 1 through gold wires 5. In addition, an insulating coating 2a which has a slight conductive property when heated is adhered to the bottom surface of the semiconductor device. Further, the surfaces of the bumps B protrude several microns from the film surface of the insulating coating 2a. Accordingly, when the anodic bond is made between the wiring conductors and the insulating coating 2a after the bumps B are positioned on the wiring conductors on the wiring substrate, the bumps B and the corresponding wiring conductors are electrically connected to each other. As a result, it is possible to mount a semiconductor device, even having a large-scale ball grid array, reliably on a wiring substrate in a short period of time.

It should be understood that the foregoing relates only to preferred embodiments of the invention, and that it is intended to cover all changes and modifications of the embodiments of the invention herein used for the purpose of the disclosure, which do not constitute departures from the spirit and scope of the invention.

What is claimed is:

1. A method of manufacturing an electronic component wherein an insulating coating that is electrically conductive when heated is adhered to a surface of a semiconductor chip except at electrodes, and a tip of each of inner leads of a lead frame is aligned with a corresponding electrode, the method including anodically bonding said inner leads and said insulating coating to each other, thereby electrically connecting said electrodes to said inner leads.

* * * * *